(12) United States Patent
Yun et al.

(10) Patent No.: US 10,868,034 B2
(45) Date of Patent: Dec. 15, 2020

(54) VERTICAL MEMORY DEVICES WITH THREE-DIMENSIONAL CHANNELS

(71) Applicant: SAMSUNG ELECTRONICS CO., LTD., Suwon-si (KR)

(72) Inventors: Jang-Gn Yun, Hwaseong-si (KR); Jae-Duk Lee, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/260,368

(22) Filed: Jan. 29, 2019

(65) Prior Publication Data

US 2019/0386019 A1 Dec. 19, 2019

(30) Foreign Application Priority Data

Jun. 15, 2018 (KR) .................. 10-2018-0068742

(51) Int. Cl.
| | |
|---|---|
| H01L 27/11582 | (2017.01) |
| H01L 27/11565 | (2017.01) |
| H01L 29/08 | (2006.01) |
| H01L 21/311 | (2006.01) |
| H01L 29/06 | (2006.01) |
| H01L 21/768 | (2006.01) |
| H01L 29/423 | (2006.01) |
| H01L 21/28 | (2006.01) |

(52) U.S. Cl.
CPC .. *H01L 27/11582* (2013.01); *H01L 21/31144* (2013.01); *H01L 21/76829* (2013.01); *H01L 27/11565* (2013.01); *H01L 29/0649* (2013.01); *H01L 29/0847* (2013.01); *H01L 29/40117* (2019.08); *H01L 29/42352* (2013.01)

(58) Field of Classification Search
CPC . H01L 51/56; H01L 51/5072; H01L 51/5012; H01L 27/3244; H01L 35/32
USPC .......................................... 257/324
See application file for complete search history.

(56) References Cited

U.S. PATENT DOCUMENTS

| | | | |
|---|---|---|---|
| 9,508,730 B2 | 11/2016 | Lee et al. | |
| 9,524,979 B2 | 12/2016 | Arai | |
| 9,824,966 B1 | 11/2017 | Kanakamedala et al. | |
| 2015/0287735 A1* | 10/2015 | Jeon ............... | H01L 27/11582 257/324 |
| 2015/0380428 A1 | 12/2015 | Matsuda | |
| 2017/0077131 A1 | 3/2017 | Konagai et al. | |
| 2017/0092654 A1* | 3/2017 | Nishikawa ....... | H01L 29/66545 |
| 2017/0125438 A1* | 5/2017 | Pachamuthu ..... | H01L 27/11582 |
| 2017/0263620 A1 | 9/2017 | Lee | |
| 2017/0373089 A1 | 12/2017 | Kim et al. | |

* cited by examiner

*Primary Examiner* — Andy Huynh
(74) *Attorney, Agent, or Firm* — Lee IP Law, P.C.

(57) ABSTRACT

A vertical memory device includes a substrate having a trench structure, gate electrodes on the substrate, the gate electrodes being spaced apart from each other in a first direction substantially vertical to an upper surface of the substrate, a channel including a vertical portion extending through the gate electrodes in the first direction, and a horizontal portion extending in the trench structure in a second direction substantially parallel to the upper surface of the substrate, the horizontal portion being connected the vertical portion, and an epitaxial layer on a first portion of the substrate and connected to the horizontal portion of the channel, the first portion of the substrate being adjacent to ends of the gate electrode in the second direction.

20 Claims, 46 Drawing Sheets

VERTICAL MEMORY DEVICES WITH THREE-DIMENSIONAL CHANNELS

CROSS-REFERENCE TO RELATED APPLICATION

Korean Patent Application No. 10-2018-0068742, filed on Jun. 15, 2018, in the Korean Intellectual Property Office (KIPO), and entitled: "Vertical Memory Devices and Methods of Manufacturing the Same," is incorporated by reference herein in its entirety.

BACKGROUND

1. Field

Example embodiments relate to a vertical memory device and a method of manufacturing the same.

2. Description of the Related Art

In order to connect a channel to a substrate in a VNAND flash memory device, after forming a channel hole, an ONO layer may be deposited on an inner wall of the channel hole, and a portion of the ONO layer may be removed using a spacer to expose an upper surface of the substrate. However, the channel hole needs to have a large width so as to sufficiently expose the upper surface of the substrate.

SUMMARY

According to example embodiments, there is provided a vertical memory device. The vertical memory device may include gate electrodes on a substrate on which a trench structure is formed, the gate electrodes being spaced apart from each other in a first direction substantially vertical to an upper surface of the substrate, a channel including a vertical portion extending through the gate electrodes in the first direction on the substrate and a horizontal portion extending in the trench structure in a second direction substantially parallel to the upper surface of the substrate to be connected the vertical portion, and an epitaxial layer on a first portion of the substrate adjacent to each of opposite ends in the second direction of the gate electrodes, the epitaxial layer being connected to the horizontal portion of the channel.

According to example embodiments, there is provided a vertical memory device. The vertical memory device may include an etch stop layer on a substrate, a channel including a plate on the etch stop layer, vertical portions each of which may extend from the plate upwardly in a first direction substantially vertical to an upper surface of the substrate, the vertical portions being arranged in each of second and third directions substantially parallel to the upper surface of the substrate and orthogonal to each other and horizontal portions each of which may extend in the third direction from the plate, gate electrodes spaced apart from each other in the first direction on the plate of the channel, each of the gate electrodes surrounding the vertical portions of the channel, and an epitaxial layer extending in the second direction on the substrate and contacting ends of the horizontal portions of the channel in the third direction.

According to example embodiments, there is provided a vertical memory device. The vertical memory device may include gate electrodes spaced apart from each other on a substrate in a first direction substantially vertical to an upper surface of the substrate, each of the gate electrodes extending in a second direction substantially parallel to the upper surface of the substrate, a channel including a vertical portion extending through the gate electrodes in the first direction on the substrate and a horizontal portion extending in a third direction, which is substantially parallel to the upper surface of the substrate and intersects the second direction, from an end of the vertical portion to a first portion of the substrate not overlapped with the gate electrodes in the first direction, and an epitaxial layer on the first portion of the substrate, the epitaxial layer contacting the horizontal portion of the channel. The epitaxial layer and an upper portion of the horizontal portion of the channel form a source region, and a lower portion of the horizontal portion of the channel may be connected to the substrate through a lower portion of the epitaxial layer.

According to example embodiments, there is provided a vertical memory device. The vertical memory device may include gate electrodes on a substrate on which a trench structure is formed, the gate electrodes being spaced apart from each other in a first direction substantially vertical to an upper surface of the substrate, a channel including a vertical portion extending through the gate electrodes in the first direction on the substrate and a horizontal portion extending in the trench structure of the substrate in a second direction substantially parallel to the upper surface of the substrate to be connected to the vertical portion, and a semiconductor layer on a first portion of the substrate adjacent to each of opposite ends in the second direction of the gate electrodes, the semiconductor layer being connected to the horizontal portion of the channel.

According to example embodiments, there is provided a vertical memory device. The vertical memory device may include gate electrodes spaced apart from each other on a substrate in a first direction substantially vertical to an upper surface of the substrate, each of the gate electrodes extending in a second direction substantially parallel to the upper surface of the substrate, a channel extending through the gate electrodes, and an epitaxial layer extending in the second direction on a portion of the substrate adjacent to each of opposite ends of the gate electrodes in a third direction, which is substantially parallel to the upper surface of the substrate and intersects the second direction, to be connected to the channel, the epitaxial layer having an upper surface not flat but curved in the second direction.

According to example embodiments, there is provided a method of manufacturing a vertical memory device. The method may include forming a first sacrificial pattern filling a trench structure on a substrate, forming a mold on the substrate and the first sacrificial pattern, the mold including an insulation layer and a second sacrificial layer alternately and repeatedly stacked in a first direction substantially vertical to an upper surface of the substrate, forming a channel hole extending through the mold to expose the first sacrificial pattern, removing the first sacrificial pattern exposed by the channel hole to form a gap corresponding to the trench structure, forming a channel in the channel hole and the gap, partially removing the mold to expose a portion of the channel, forming an epitaxial layer on the exposed portion of the channel so as to connect the channel and the substrate, implanting impurities into a portion of the epitaxial layer to form a source region, and replacing the second sacrificial layer with a gate electrode.

According to example embodiments, there is provided a method of manufacturing a vertical memory device. The method may include forming an etch stop layer on a substrate, forming an insulating interlayer on the etch stop layer, the insulating interlayer containing a first sacrificial pattern therein, forming a mold on the insulating interlayer and the first sacrificial pattern, the mold including an insulation layer and a second sacrificial layer alternately and repeatedly stacked in a first direction substantially vertical to an upper surface of the substrate, forming a channel hole extending through the mold to expose the first sacrificial pattern, removing the first sacrificial pattern exposed by the channel hole to form a gap, forming a channel in the channel hole and the gap, forming an opening extending through the mold and the channel to expose an end of the channel and a portion of the etch stop layer, removing the exposed portion of the etch stop layer to expose an upper surface of the substrate, and forming an epitaxial layer on the exposed upper surface of the substrate to connect the channel and the substrate.

According to example embodiments, there is provided a method of manufacturing a vertical memory device. The method may include forming a first sacrificial pattern extending through an upper portion of a substrate, the first sacrificial pattern including a first extension portion and a second extension portion connected thereto, forming a mold on the substrate and the first sacrificial pattern, the mold including an insulation layer and a second sacrificial layer alternately and repeatedly stacked in a first direction substantially vertical to an upper surface of the substrate, forming a channel hole extending through the mold to expose the first sacrificial pattern, removing the first sacrificial pattern exposed by the channel hole to form first and second gaps corresponding to the first and second extension portions, respectively, of the first sacrificial pattern, sequentially forming a charge storage structure and a channel in the channel hole and the first and second gaps, partially removing the mold to form an opening to expose a portion of the charge storage structure in the second gap, removing the portion of the charge storage structure exposed by the opening to expose a portion of the channel, forming an epitaxial layer to cover the exposed portion of the channel and contact the substrate, and implanting impurities into a portion of the epitaxial layer to form a source region.

BRIEF DESCRIPTION OF THE DRAWINGS

Features will become apparent to those of skill in the art by describing in detail exemplary embodiments with reference to the attached drawings, in which.

DETAILED DESCRIPTION

A vertical memory device and a method of manufacturing the same in accordance with example embodiments will be described more fully hereinafter with reference to the accompanying drawings.

Figure 1:
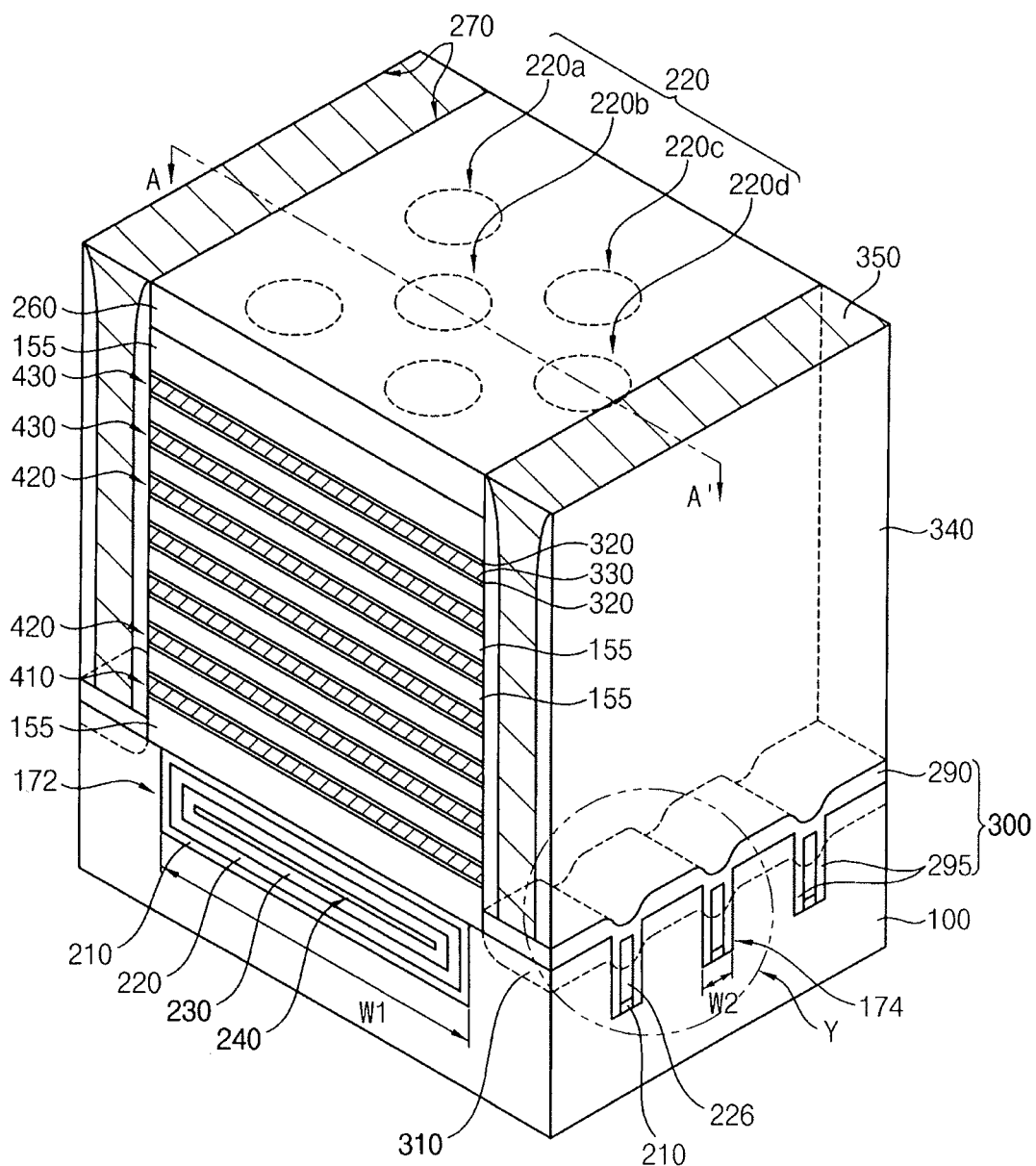
FIG. 1 illustrates a perspective view of a vertical memory device in accordance with example embodiments.
Figure 2:
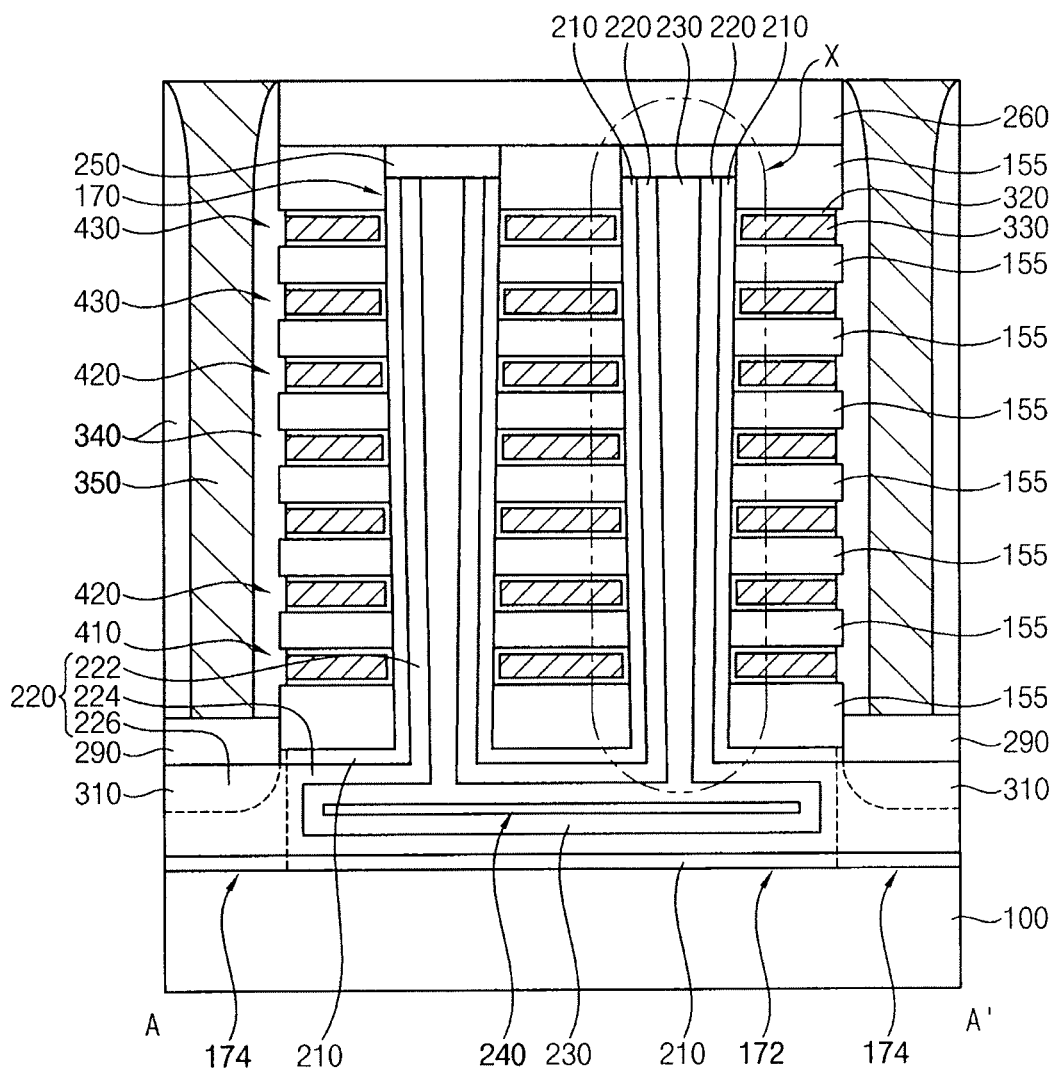
FIG. 2 illustrates a cross-sectional view taken along line A-A' of FIG. 1.
Figure 2:
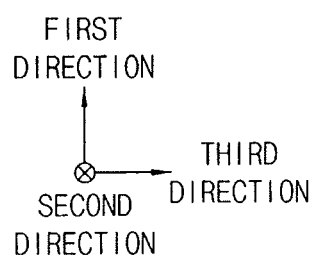
Figure 3:
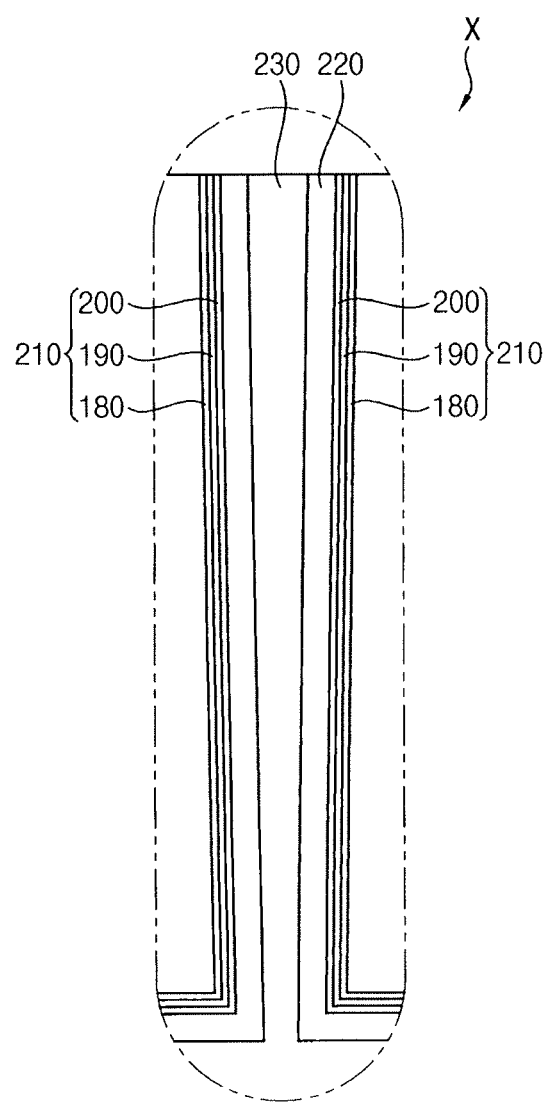
FIG. 3 illustrates an enlarged cross-sectional view of region X of FIG. 2.
Figure 4:
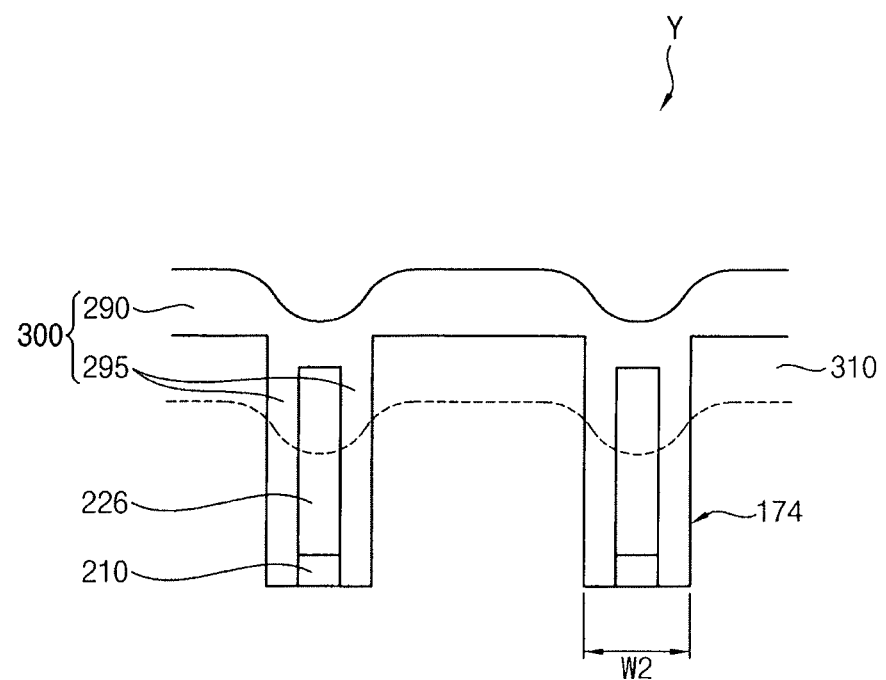
FIG. 4 illustrates a side view of region Y of FIG. 1.

FIG. 1 is a perspective view illustrating a vertical memory device in accordance with example embodiments, FIG. 2 is a cross-sectional view taken along line A-A' of FIG. 1, FIG. 3 is an enlarged cross-sectional view of region X of FIG. 2, and FIG. 4 is side view of a region Y of FIG. 1. It is noted that line A-A' of FIG. 1 intersects element 226 in a second gap 174, which is illustrated in FIG. 2.

Hereinafter, a direction substantially vertical to an upper surface of a substrate is defined as a first direction, and two directions intersecting with each other among horizontal directions substantially parallel to the upper surface of the substrate are defined as second and third directions, respectively. In example embodiments, the second and third directions may be orthogonal to each other.

Referring to FIGS. 1 to 4, a vertical memory device may include a gate electrode structure, a charge storage structure 210, a channel 220, a first epitaxial layer 300, and a common source line (CSL) 350 on a substrate 100. The vertical memory device may further include an insulation pattern 155, a filling pattern 230, a capping pattern 250, a second blocking pattern 320, a spacer 340, and a first insulating interlayer 260.

The substrate 100 may include semiconductor materials, e.g., silicon, germanium, silicon-germanium, etc., or III-V compounds, e.g., GaP, GaAs, GaSb, etc. In example embodiments, the substrate 100 may be a silicon-on-insulator (SOI) substrate or a germanium-on-insulator (GOI) substrate.

The gate electrode structure may include a plurality of gate electrodes at a plurality of levels, respectively, which may be spaced apart from each other in the first direction on the substrate 100. The insulation pattern 155 may be interposed between the gate electrodes at the respective levels. The gate electrode structure may extend in the second direction, and a plurality of gate electrode structures may be formed to be spaced apart from each other in the third direction by a first opening 270 extending in the second direction. That is, each of the gate electrodes extending in the second direction at the same level may be spaced apart from each other by the first opening 270.

Each of the gate electrodes may include a gate conductive pattern 330 and a barrier pattern covering upper and lower surfaces and a sidewall of the gate conductive pattern 330. The gate conductive pattern 330 may include a low resistance metal, e.g., tungsten, titanium, tantalum, platinum, etc., and the barrier pattern may include a metal nitride, e.g., titanium nitride, tantalum nitride, etc. The insulation pattern 155 may include an oxide, e.g., silicon oxide. For example, as illustrated in FIG. 1, a plurality of gate conductive patterns 330 and a plurality of insulation patterns 155 may be stacked alternately on the substrate 100 along the first direction.

The upper and lower surfaces and the sidewall of each of the gate electrodes may be covered by the second blocking pattern 320. Although not shown, the second blocking pattern 320 may cover a sidewall of each of the insulation patterns 155 adjacent to the first opening 270. The second blocking pattern 320 may include a metal oxide, e.g., aluminum oxide, hafnium oxide, etc.

Each of the gate electrode structures may include a first gate electrode 410, a plurality of second gate electrodes 420, and at least one third gate electrode 430 sequentially stacked in the first direction on the substrate 100.

FIGS. 1 and 2 illustrate the first gate electrode 410 at one level, the second gate electrodes 420 at respective four levels, and the third gate electrodes 430 at respective two levels. However, embodiments are not limited thereto. For example, the first gate electrodes 410 may be formed at two levels, respectively, and the second gate electrodes 420 may be formed at more than five levels, respectively.

In example embodiments, the first gate electrode 410 may serve as a ground selection line (GSL), the second gate electrode 420 may serve as a word line, and the third gate electrode 430 may serve as a string selection line (SSL). The first gate electrode 410 and/or one or ones of the second gate electrodes 420 adjacent to the third gate electrode 430 may serve as a dummy word line.

The charge storage structure 210 and the channel 220 may be formed in a channel hole 170 extending through the gate electrode structure and the insulation patterns 155 in the first direction on the substrate 100, as illustrated in FIG. 2. A first gap 172 extending in the second direction at an upper portion of the substrate 100 may be connected to, e.g., the bottom of, the channel hole 170, as illustrated in FIG. 2, and a second gap 174 extending in the third direction at the upper portion of the substrate 100 may be connected to the first gap 172.

A plurality of channel holes 170 may be formed in each of the second and third directions. For example, as illustrated in FIGS. 1-2, each channel hole 170 may extend in the first direction, e.g., to have a hollow cylindrical shape, while the plurality of channel holes 170 may be arranged to be spaced apart from each other in the second and third directions, e.g., in a matrix or zigzag pattern. A channel hole column including the plurality of channel holes 170 in the second direction may be defined, and a channel hole array including a plurality of channel hole columns in the third direction may be defined. The channels 220 in the respective channel holes 170 may also define a channel column and a channel array correspondingly to the channel hole column and the channel hole array, respectively. In FIG. 1, the channel array including first to fourth channel columns 220a, 220b, 220c and 220d is shown.

In example embodiments, the first gap 172 may be connected to a plurality of channel holes 170 thereon, e.g., the first gap 172 may extend in the second direction to overlap and be connected to a bottom of each of the plurality of channel holes 170. A plurality of second gaps 174 may be formed in the second direction to be connected to the first gap 172 at the same level, e.g., the plurality of second gaps 174 may extend in the third direction and be spaced apart from each other in the second direction (FIG. 1).

In example embodiments, as illustrated in FIG. 2, the channel 220 may include a vertical portion 222 extending in the first direction in the channel hole 170, a plate 224 extending from the vertical portion 222 in the second direction in the first gap 172, and a horizontal portion 226 extending from the plate 224 in the third direction in the second gap 174. For example, as illustrated in FIG. 2, the vertical portion 222 may continuously cover the inner sidewalls of each the channel hole 170 along the first direction, while the plate 224 may continuously extend from the vertical portion 222 of each channel hole 170 in the first gap 172 to extend in the second direction, e.g., toward adjacent channel holes 170. As further illustrated in FIG. 2, portions of the plate 224 adjacent to the first opening 270 may be formed to extend in the third direction, e.g., toward adjacent second gaps 174, such that the horizontal portions 226 in the respective second gaps 174 are extended in the second direction in the first gap 172 to be connected to each other, and may be considered to be included in the horizontal portion 226, e.g., combined with the plate 224 (via imaginary dashed line in FIG. 2).

The first gap 172 may have a first width W1 in the third direction, and each of the second gaps 174 may have a second width W2 smaller than the first width W1 in the second direction.

As illustrated in FIG. 2, in example embodiments, the charge storage structure 210, the vertical portion 222 of the channel 220, and the filling pattern 230 may be sequentially stacked from an inner wall of the channel hole 170 toward an inside, e.g., center, thereof. Further, the charge storage structure 210, the plate 224 of the channel 220, the filling pattern 230, and a first air gap 240 may be sequentially stacked from an inner wall of the first gap 172 toward an inside, e.g., center, thereof (FIG. 1). The charge storage structure 210 and the horizontal portion 226 of the channel 220 may be sequentially stacked from a lower surface of each of the second gaps 174 (FIG. 1). However, the first epitaxial layer 300 may be further formed in each of the second gaps 174. That is, an upper surface of the horizontal portion 226 of the channel 220 may be covered by a first portion 290 of the first epitaxial layer 300, and opposite sidewalls in the second direction of the charge storage structure 210 and the horizontal portion 226 of the channel 220 may be covered by a second portion 295 of the first epitaxial layer 300, as will be described in more detail below.

In example embodiments, as illustrated in FIG. 3, the charge storage structure 210 may include a first blocking pattern 180, a charge storage pattern 190, and a tunnel insulation pattern 200 sequentially stacked. The first blocking pattern 180, the charge storage pattern 190, and the tunnel insulation pattern 200 may include, e.g., silicon oxide, silicon nitride, and silicon oxide, respectively.

The channel 220 may include, e.g., undoped polysilicon, or polysilicon lightly doped with N-type or P-type impurities. The filling pattern 230 may include an oxide, e.g., silicon oxide.

The capping pattern 250 may contact upper surfaces of the filling pattern 230, the channel 220, and the charge storage structure 210, and may include, e.g., polysilicon doped with N-type or P-type impurities.

The first insulating interlayer 260 may be formed on the capping pattern 250 and on an uppermost one of the insulation patterns 155. The first insulating interlayer 260 may include an oxide, e.g., silicon oxide.

The first epitaxial layer 300 may include the first portion 290 and the second portion 295. The first portion 290 may be formed on the horizontal portion 226 of the channel 220 in each of the second gaps 174, and may further extend under the first opening 270 on a portion of the substrate 100 adjacent thereto in the second direction. The second portion 295 covers the opposite sidewalls in the second direction of the charge storage structure 210 and the horizontal portion 226 of the channel 220 sequentially stacked in each of the second gaps 174. That is, the first portion 290 of the first epitaxial layer 300 may extend, e.g., continuously, in the second direction on the upper surface of the substrate 100 and on the upper surface of the horizontal portion 226, and the second portion 295 of the first epitaxial layer 300 may extend from the first portion 290 in the first direction downwardly into the second gaps 174.

In example embodiments, the first epitaxial layer 300 may have an upper surface that may not be flat but curved in the second direction. In one embodiment, a portion of the first epitaxial layer 300 on the upper surface of the horizontal portion 226 of the channel 220 may be lower than a portion of the first epitaxial layer 300 on the upper surface of the substrate 100, however, embodiments are not limited thereto. The first epitaxial layer 300 may include a semiconductor material, e.g., single crystalline silicon and/or polysilicon, and thus may be also referred to as a first semiconductor layer.

In other embodiments, the first epitaxial layer 300 may be replaced with a layer including a metal or a metal silicide instead of a semiconductor material. That is, instead of the first epitaxial layer 300 including single crystalline silicon and/or polysilicon, a metal layer and/or a metal silicide layer may be formed.

A portion of the channel 220 in the second gap 174, i.e., the horizontal portion 226 of the channel 220, may be connected to a portion of the substrate 100 spaced apart therefrom in the second direction by the first epitaxial layer 300.

In example embodiments, an upper portion of the first epitaxial layer 300, i.e., the first portion 290 and an upper portion of the second portion 295, may be doped with impurities, and an upper portion of the horizontal portion 226 of the channel 220 and an upper portion of the substrate 100, which may be adjacent to the upper portion of the second portion 295 of the first epitaxial layer 300 in the second direction, may be also doped with the impurities. Accordingly, a first source region 310 may be formed at the upper portion of the first epitaxial layer 300, the upper portion of the horizontal portion 226 of the channel 220, and the upper portion of the substrate 100 (e.g., boundaries of the first source region 310 are indicated with dashed lines in FIGS. 1-2). In one embodiment, according to the profile of the upper surface of the first epitaxial layer 300, the profile of a lower surface of the first source region 310 may also have a shape that may not be flat but curved. The impurities may include, e.g., N-type or P-type impurities.

In example embodiments, the CSL 350 may extend in the second direction in the first opening 270, and a spacer 340 may be formed on each of opposite sidewalls in the third direction of the CSL 350. In example embodiments, a lower surface of the CSL 350 may contact the upper surface of the first epitaxial layer 300, and thus may be electrically connected to the first source region 310. The CSL 350 may include a metal, a metal nitride and/or a metal silicide, and the spacer 340 may include an oxide, e.g., silicon oxide.

In the vertical memory device in accordance with example embodiments, the channel 220 may include the vertical portion 222 extending through the gate electrodes in the first direction and the horizontal portion 226, which may be connected to the vertical portion 222 through the plate 224 and may be formed on the substrate 100 to extend in the third direction. A lower sidewall of a portion of the horizontal portion 226 of the channel 220 not overlapping the gate electrodes in the first direction, e.g., a portion in the second gap 174 surrounded by the first epitaxial layer 300, may be connected to the substrate 100 through the second portion 295 of the first epitaxial layer 300. An upper portion of the horizontal portion 226 of the channel 220 may contact the first portion 290 of the first epitaxial layer 300 so as to form the first source region 310 (e.g., portion of the horizontal portion 226 above the dashed line in FIG. 4), and may be electrically connected to the overlying CSL 350.

The channel 220 may not be directly connected to the substrate 100 through the vertical portion 222 thereof, but may be connected to the substrate 100 through the horizontal portion 226 thereof and the first epitaxial layer 300. Thus, the channel hole 170, in which the vertical portion 222 of the channel 220 and the charge storage structure 210 surrounding an outer sidewall thereof are positioned, may not have a large size, so that the vertical memory device may have an improved degree of integration. This will be described in detail below with reference to a method of manufacturing the vertical memory device.

Figure 9:
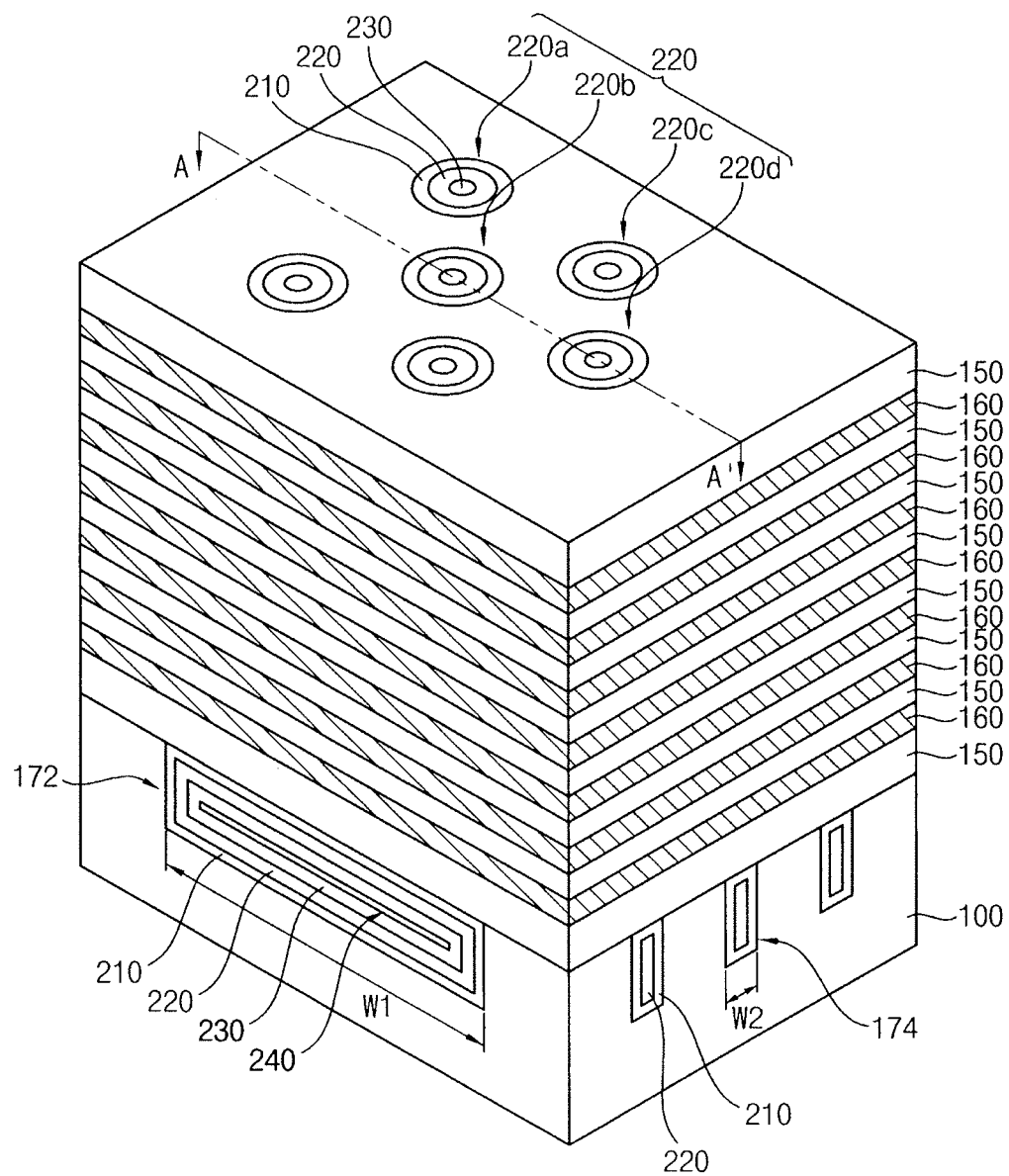
Figure 9:
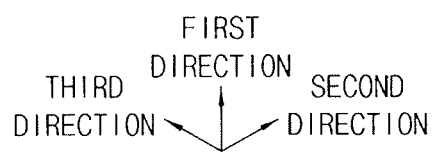
Figure 10:
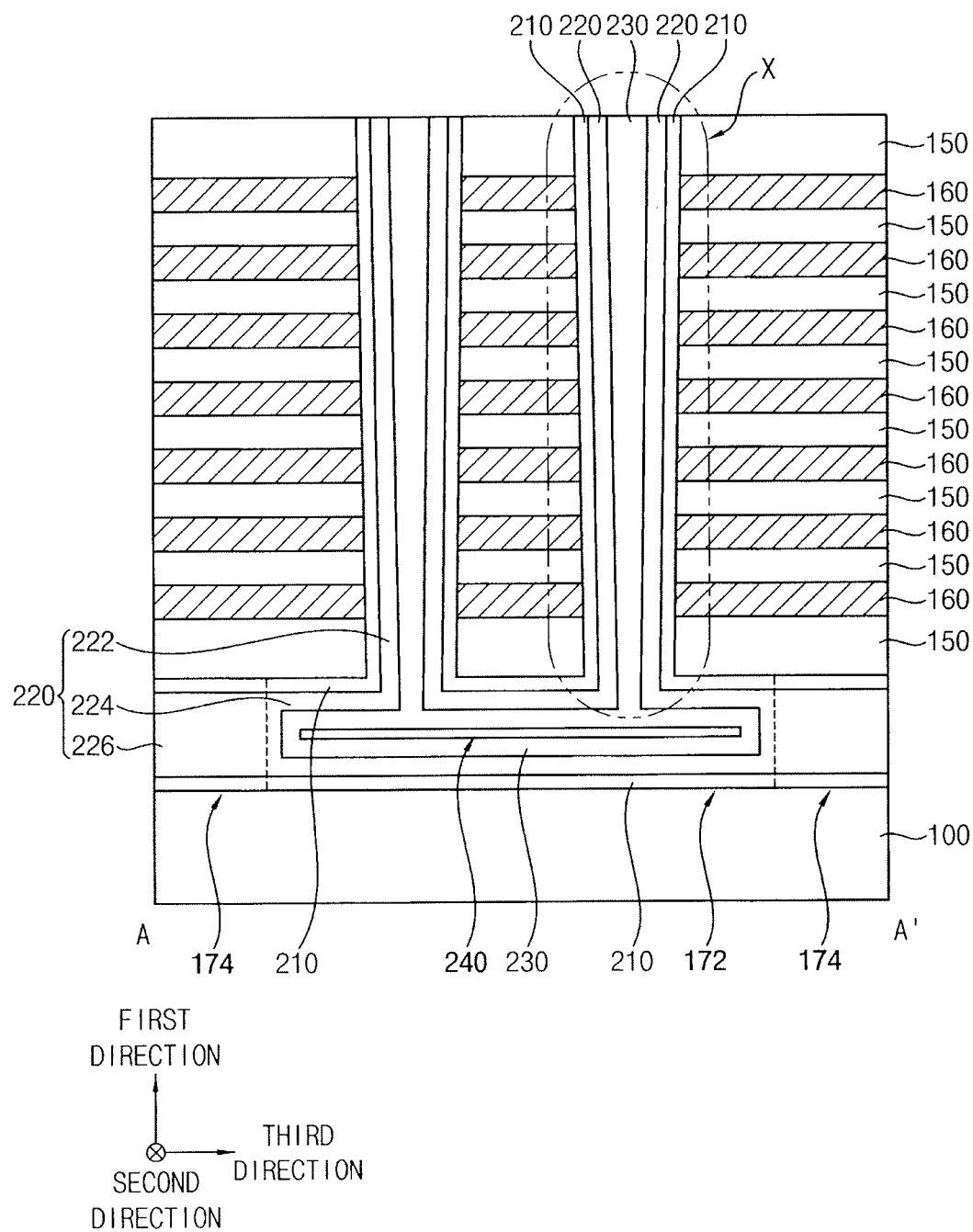
Figure 11:
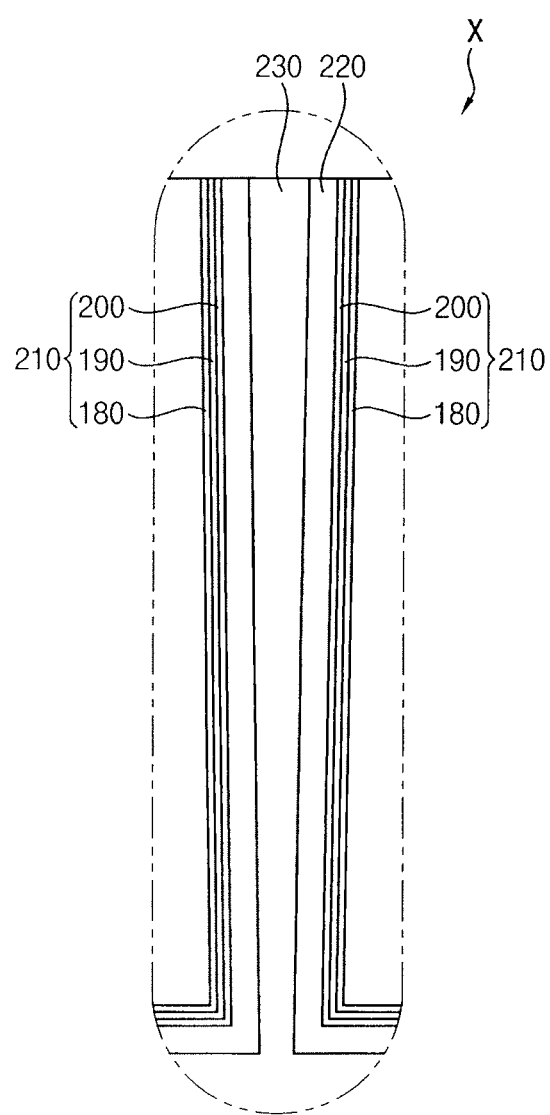

FIGS. 5 to 21 are perspective views, cross-sectional views, and side views illustrating stages in a method of manufacturing a vertical memory device in accordance with example embodiments. Specifically, FIGS. 5 to 7, 9, 12, 14, 17 and 20 are perspective views, FIGS. 8, 10, 13, 15, 18 and 21 are cross-sectional views taken along line A-A' of respective corresponding perspective views, FIG. 11 is an enlarged cross-sectional view of region X of FIG. 10, and FIGS. 16 and 19 are side views of region Y of respective corresponding perspective views.

Figure 5:
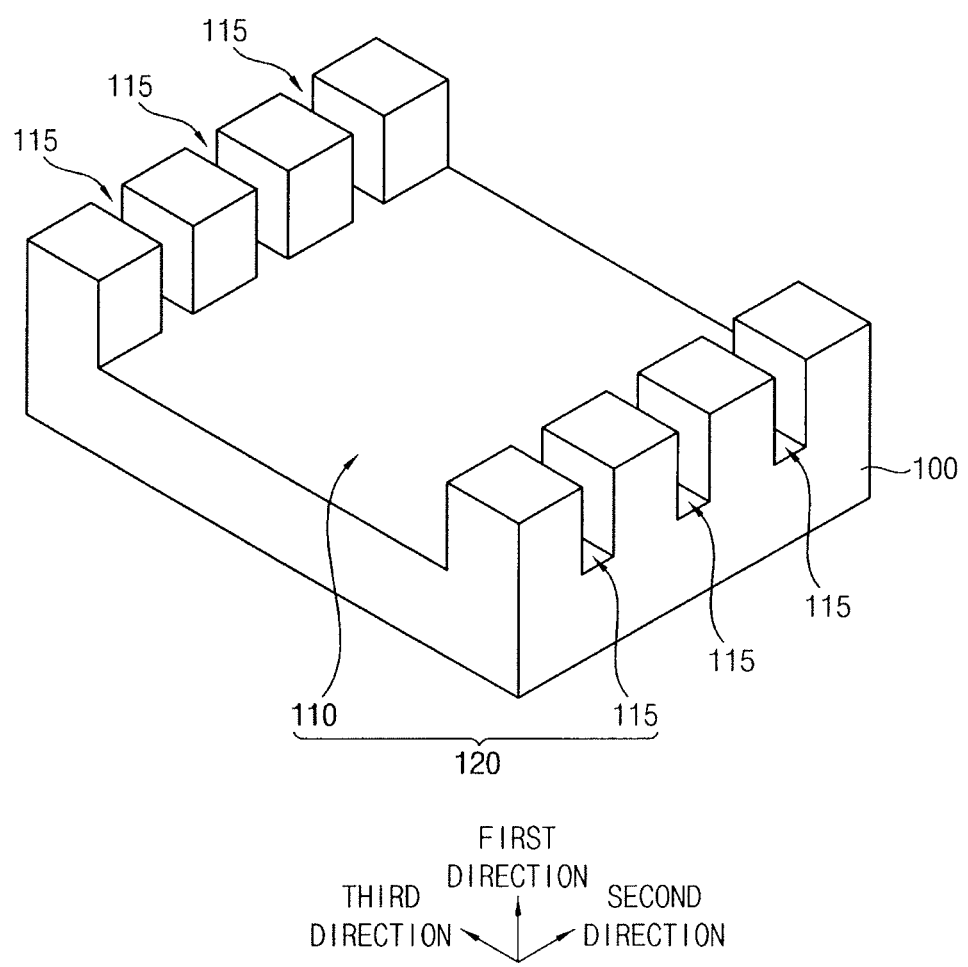
FIGS. 5 to 21 illustrate perspective, cross-sectional, and side views of stages in a method of manufacturing a vertical memory device in accordance with example embodiments.

Referring to FIG. 5, a trench structure 120 may be formed on the substrate 100. In example embodiments, the trench structure 120 may include a first trench 110 extending in the second direction and a plurality of second trenches 115, which may extend in the third direction to be connected to the first trench 110 and may be spaced apart from each other in the second direction. For example, as illustrated in FIG. 5, the first trench 110 may have a quadrangular, e.g., rectangular, shape in plan view that extends in the second and third directions, and the plurality of second trenches 115 may be in fluid communication with the first trench 110 and aligned along opposite sides of the first trench 110.

Figure 6:
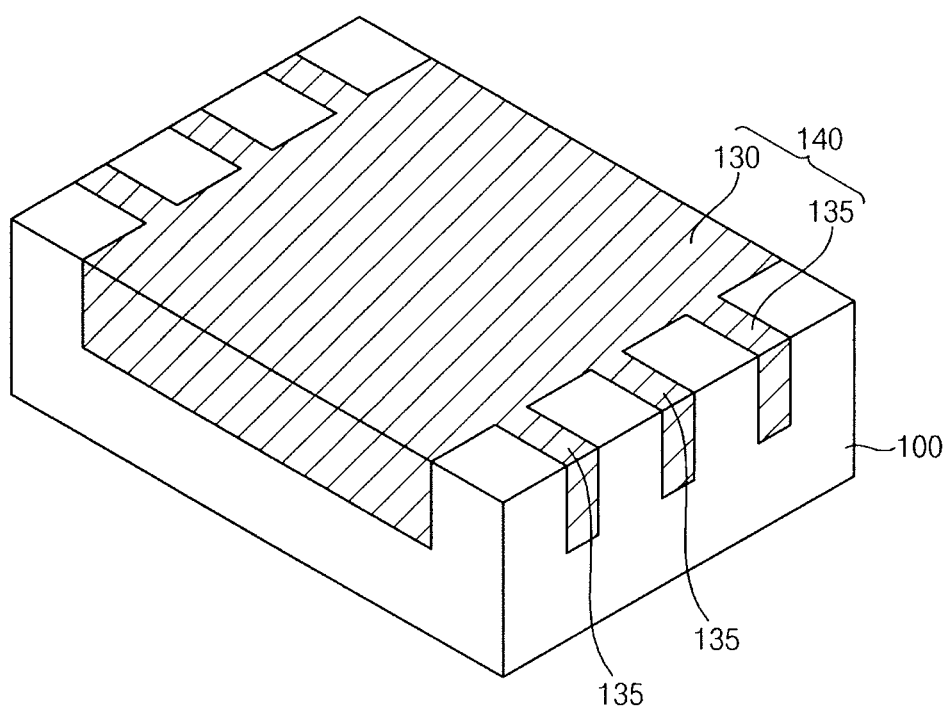
Figure 6:
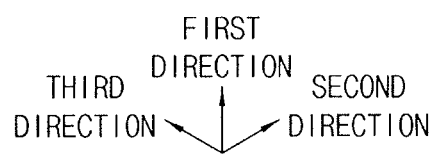

Referring to FIG. 6, a first sacrificial pattern 140 may be formed in the trench structure 120 on the substrate 100. The first sacrificial pattern 140 may be formed by forming a first sacrificial layer on the substrate 100 to, e.g., completely, fill the trench structure 120, and planarizing the first sacrificial layer until an upper surface of the substrate 100 may be exposed. The first sacrificial layer may include, e.g., silicon-germanium (SiGe), and the planarization process may include, e.g., a chemical mechanical polishing (CMP) process and/or an etch back process.

In example embodiments, the first sacrificial pattern 140 may include first and second extension portions 130 and 135 in the first and second trenches 110 and 115, respectively. The first and second extension portions 130 and 135 may extend in the second and third directions, respectively.

Figure 7:
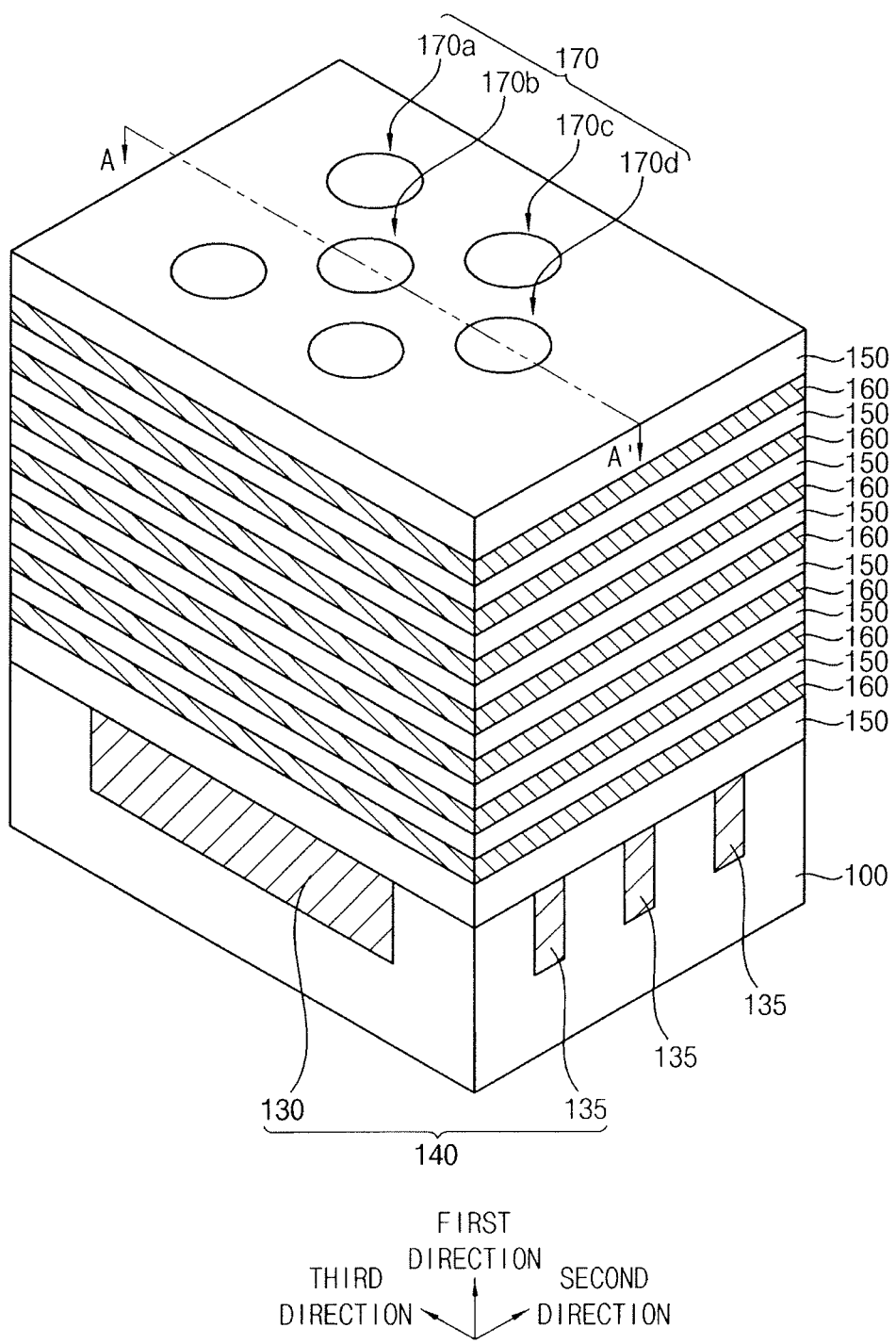
Figure 8:
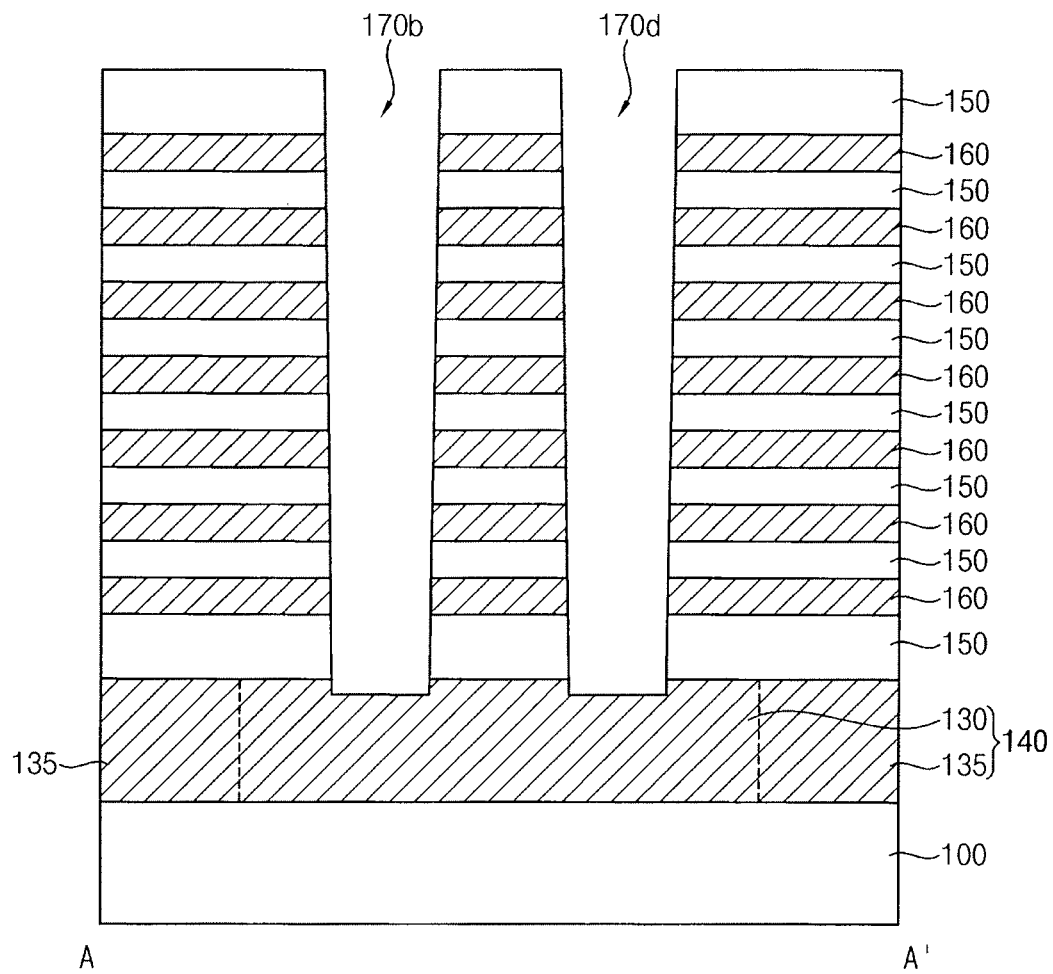
Figure 8:
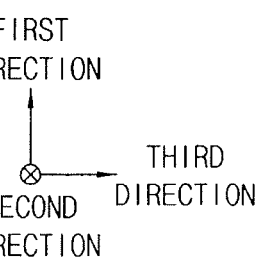

Referring to FIGS. 7 and 8, an insulation layer 150 and a second sacrificial layer 160 may be alternately and repeatedly stacked on the, e.g., entire, substrate 100 and the first sacrificial pattern 140 in the first direction to form a mold. In example embodiments, the insulation layer 150 may include an oxide, e.g., silicon oxide, and the second sacrificial layer 160 may include a material having a high etching selectivity with respect to the insulation layer 150, e.g., a nitride such as silicon nitride. The insulation layer 150 and the second sacrificial layer 160 may be formed by, e.g., a chemical vapor deposition (CVD) process, a plasma enhanced chemical vapor deposition (PECVD) process, an atomic layer deposition (ALD) process, etc.

After forming a first etching mask on an uppermost one of the insulation layers 150, the channel hole 170 may be formed through the mold by a dry etching process using the first mask as an etching mask to expose an upper surface of the first extension portion 130 of the first sacrificial pattern 140. The plurality of channel holes 170 may be formed in each of the second and third directions, and thus a channel hole column and a channel hole array may be defined by the channel holes 170. FIG. 7 illustrates that the channel hole array includes first to fourth channel hole columns 170a, 170b, 170c and 170d sequentially arranged in the third direction, however, embodiments are not limited thereto. The first etching mask may be removed.

Referring to FIGS. 9 to 12, the first extension portion 130 of the first sacrificial pattern 140 exposed by the channel hole 170 and the second extension portion 135 of the first sacrificial pattern 140 connected thereto may be removed to form first and second gaps 172 and 174, respectively. For example, referring to FIG. 7, the first and second extension portions 130 and 135 may be completely removed to form connected openings, e.g., one cavity composed of the connected openings, instead of the first and second extension portions 130 and 135, so the openings are defined between the substrate 100 and the lowermost insulation layer 150, and are interconnected and are in fluid communication with the bottoms of the channel holes 170. In example embodiments, the removal process may include a wet etching process, e.g., using an etchant having a higher etching rate of the material of the first sacrificial pattern 140 with respect to those of the substrate 100 and the insulation layer 150. The first gap 172 (replacing the first extension portion 130) may have a first width W1 in the third direction, and each of the second gaps 174 (replacing the second extension portions 135) may have a second width smaller than the first width W1 in the second direction.

The first charge storage structure 210, the channel 220, and the filling pattern 230 may be sequentially formed, e.g., via deposition, in the channel hole 170 and the first and second gaps 172 and 174. In detail, a charge storage structure layer and a channel layer may be sequentially formed on a sidewall of the channel hole 170, inner walls of the first and second gaps 172 and 174, and an upper surface of the uppermost one of the insulation layers 150, a filling layer may be formed on an inner wall of the channel layer to fill remaining a portion of the channel holes 170, and the filling layer, the channel layer and the charge storage structure layer may be planarized until the upper surface of the uppermost one of the insulation layers 150 may be exposed.

In example embodiments, the charge storage structure layer, the channel layer, and the filling layer may fill the channel hole 170, however, may not fill the first gap 172 having the first width W1. Thus, the first air gap 240 may be formed at a central portion of the first gap 172. The second gap 174 having the second width W2 smaller than the first width W1 may be filled with only the charge storage structure layer and the channel layer.

Accordingly, the charge storage structure 210, the channel 220, and the filling pattern 230 may be sequentially stacked from the sidewall of the channel hole 170 toward an inside thereof, the charge storage structure 210, the channel 220, and the filling pattern 230 may be sequentially stacked from the inner wall of the first gap 172 toward an inside thereof, and the charge storage structure 210, the channel 220, and the filling pattern 230 may be sequentially stacked from the inner wall of the second gap 174 toward an inside thereof.

As the channel holes 170, in which the channels 220 are formed, may define the channel hole column and the channel hole array, the channels 220 in the channel holes 170 may also define a channel column and a channel array correspondingly. Accordingly, FIG. 9 illustrates that the channel array includes first to fourth channel columns 220a, 220b, 220c, and 220d.

Hereinafter, a portion of the channel 220 in the channel hole 170 is referred to as the vertical portion 222 of the channel 220, a portion of the channel 220 in the first gap 172 is referred to as the plate 224 of the channel 220, and a portion of the channel 220 in the second gap 174 is referred to as the horizontal portion 226 of the channel 220.

In example embodiments, the charge storage structure 210 may include the first blocking pattern 180, the charge storage pattern 190, and the tunnel insulation pattern 200 sequentially stacked.

Figure 12:
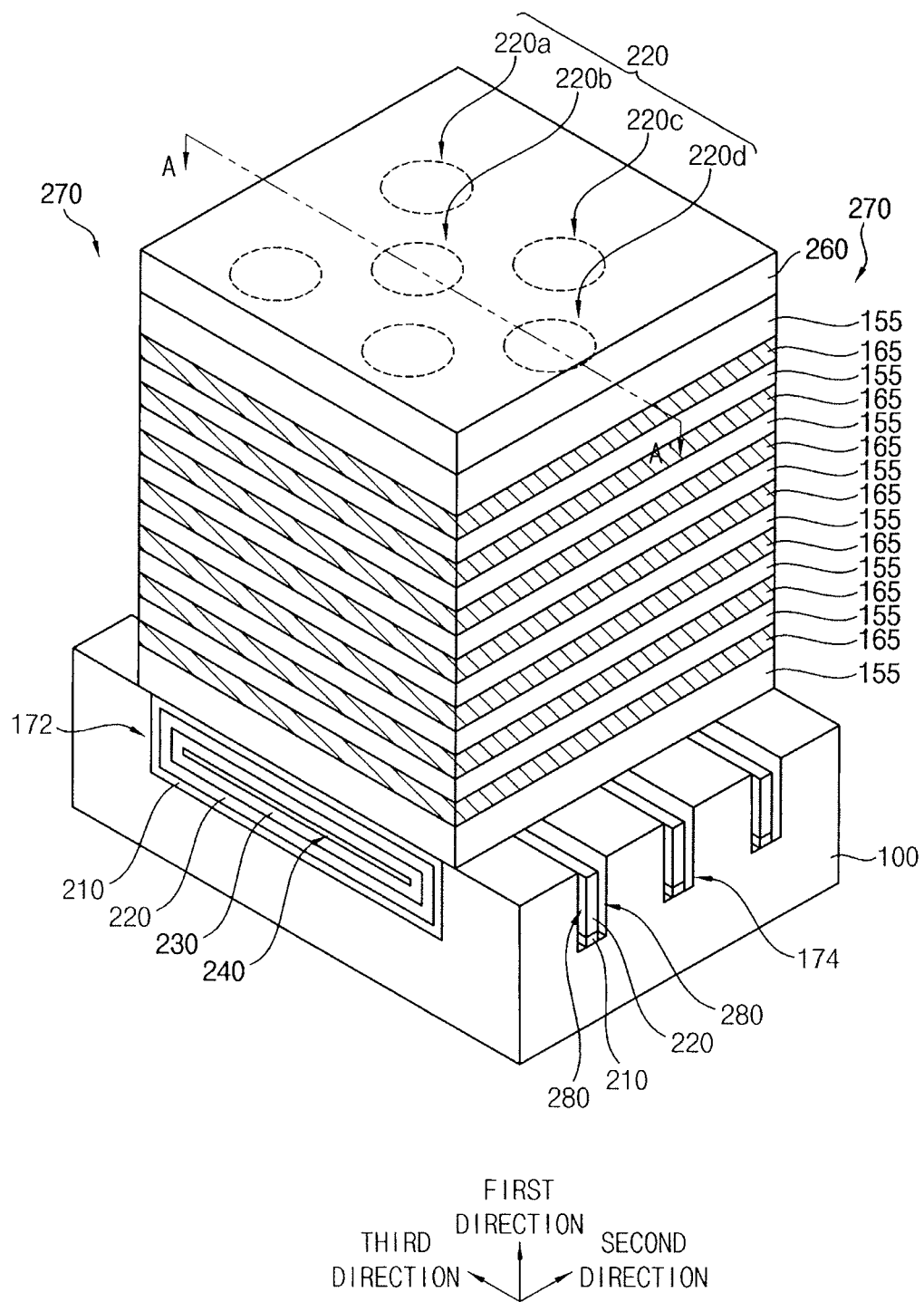
Figure 13:
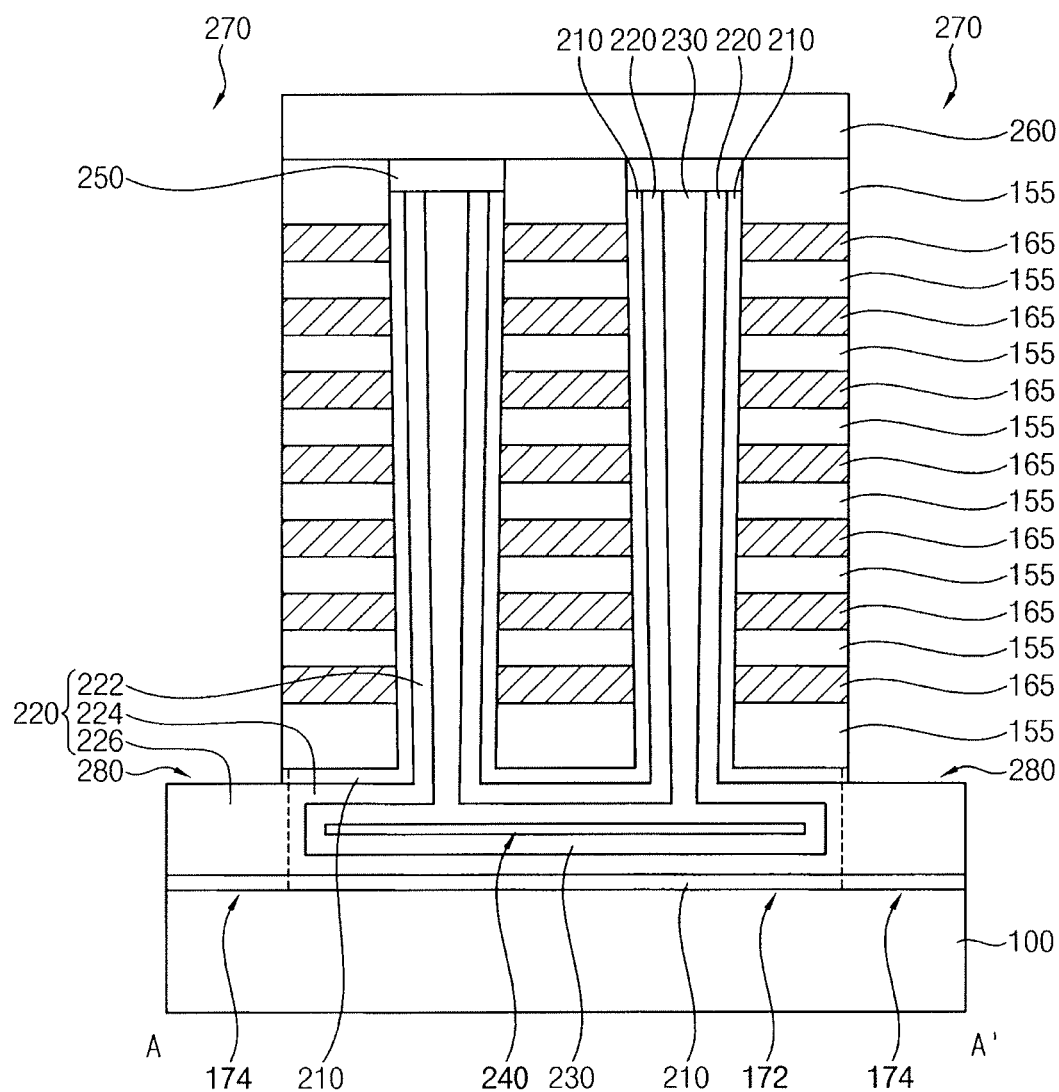

Referring to FIGS. 12 and 13, upper portions of the filling pattern 230, the channel 220, and the charge storage structure 210 may be removed to form a recess. A capping layer may be formed on the uppermost one of the insulation layers 150 to fill the recess, and the capping layer may be planarized until the upper surface of the uppermost one of the insulation layers 150 may be exposed to form the capping pattern 250.

After forming the first insulating insulation layer 260 on the uppermost one of the insulation layers 150 and the capping pattern 250, a dry etching process using a second mask may be performed to form the first opening 270 through the first insulating interlayer 260 and the mold, which may expose an upper surface of the substrate 100 and an upper surface of a portion of the charge storage structure 210 in each of the second gaps 174.

In example embodiments, the first opening 270 may extend in the second direction, and a plurality of first openings 270 may be formed in the third direction. As the first opening 270 is formed, the insulation layer 150 may be transformed into the insulation pattern 155 extending in the second direction, and the second sacrificial layer 160 may be transformed into a second sacrificial pattern 165 extending in the second direction. In example embodiments, the first opening 270 may overlap only the second gaps 174 in the first direction, and may not overlap the first gap 172 (FIG. 12).

As illustrated in FIG. 12, the portion of the charge storage structure 210 exposed by the first opening 270 may be removed to form a third gap 280 exposing an upper surface and a sidewall of a portion of the channel 220 in each of the second gaps 174, i.e., an upper surface and a sidewall of the horizontal portion 226 of the channel 220 (fin channel). A portion of the charge storage structure 210 under the horizontal portion 226 of the channel 220 in the third gap 280 may not be removed but may remain.

Figure 14:
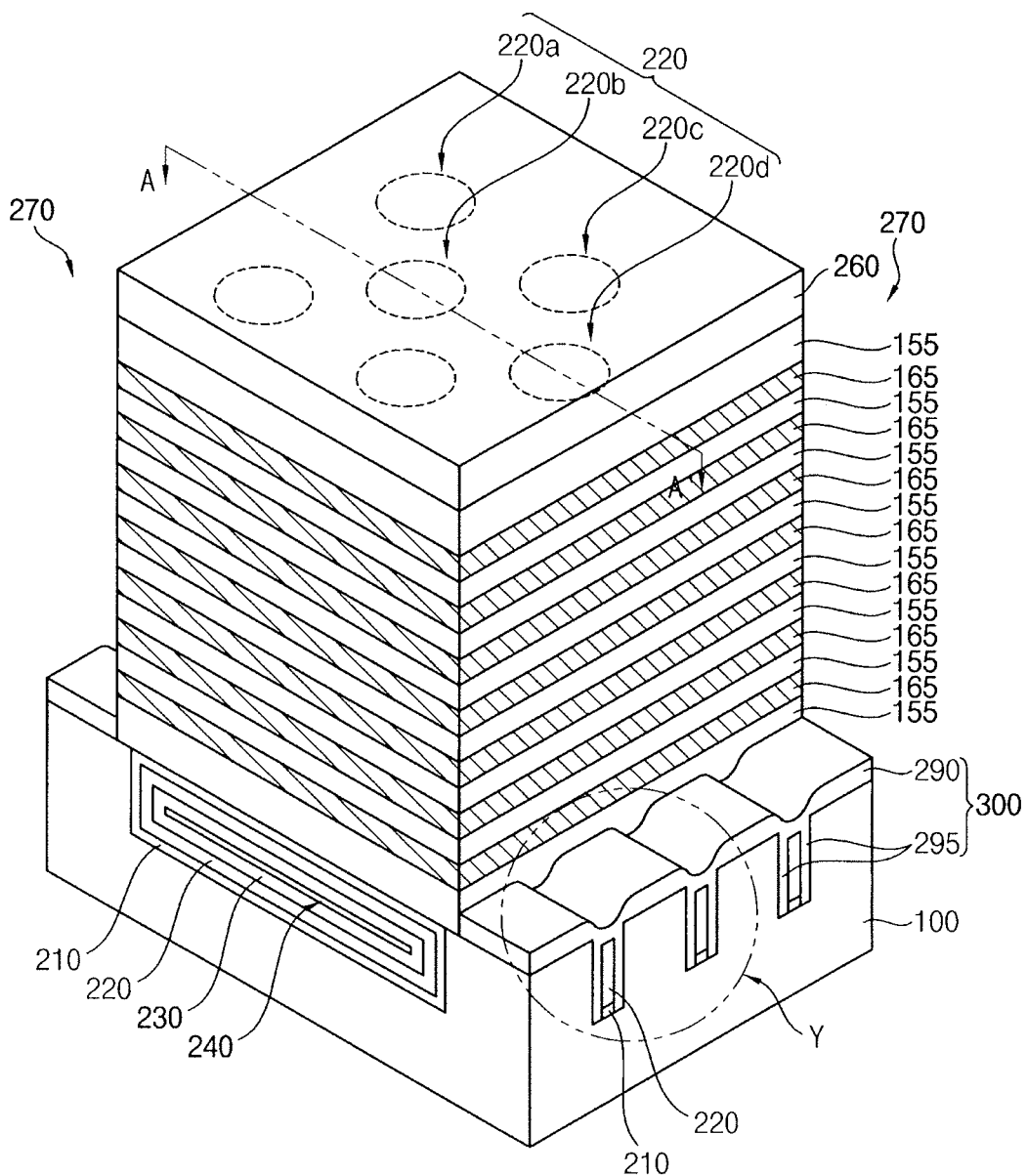
Figure 15:
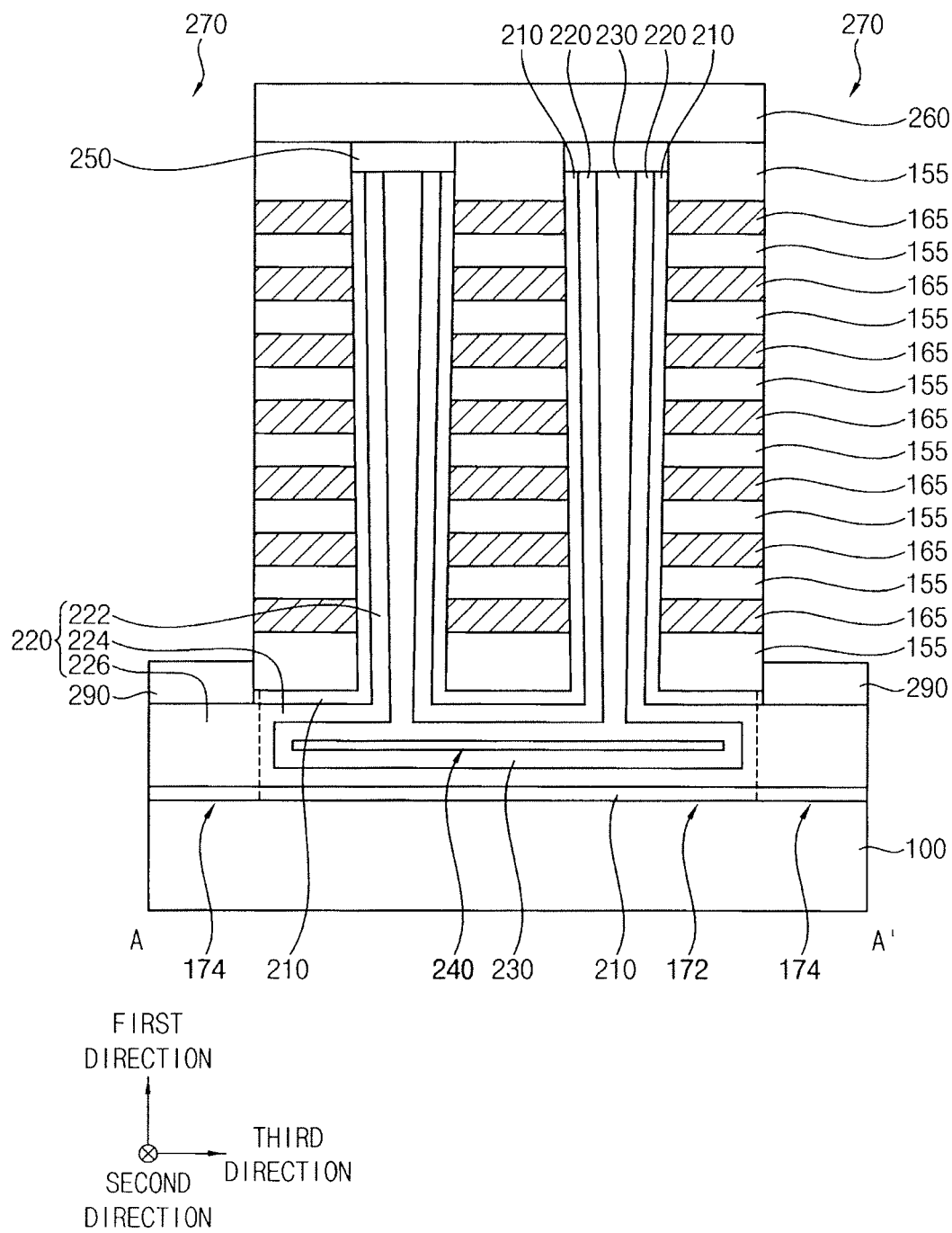
Figure 16:
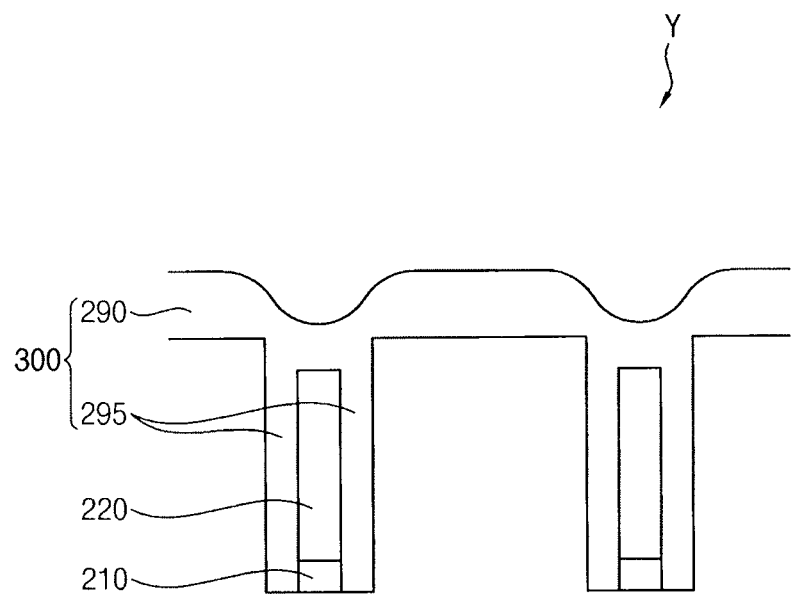

Referring to FIGS. 14 to 16, a selective epitaxial growth (SEG) process may be performed using the upper surface of the substrate exposed by the first opening 270 and the portion of the horizontal portion 226 of the channel 220 exposed by the third gap 280 as a seed to form the first epitaxial layer 300.

Accordingly, the first epitaxial layer 300 may fill the third gap 280, and may grow on the upper surface of the substrate 100 and the upper surface of the horizontal portion 226 of the channel 220 to extend in the second direction. Hereinafter, a portion of the first epitaxial layer 300 extending on the upper surface of the substrate 100 and the upper surface of the horizontal portion 226 of the channel 220 in the second direction may be referred as the first portion 290, and a portion of the first epitaxial layer 300 extending from the first portion 290 thereof in the first direction downwardly to fill the third gap 280 may be referred as the second portion 295.

An upper surface of the first epitaxial layer 300 may have a non-uniform height in the second direction depending on the material and the height of the substrate 100 and the horizontal portion 226 of the channel 220 that may be used as a seed. Accordingly, the first epitaxial layer 300 may have an upper surface that may not be flat but curved in the second direction. For example, a portion of the first epitaxial layer 300 on the upper surface of the horizontal portion 226 of the channel 220 may be lower, e.g., thinner, in the first direction than a portion of the first epitaxial layer 300 on the upper surface of the substrate 100 in the first direction. However, embodiments are not limited thereto.

As the first epitaxial layer 300 is formed, a portion of the channel 220 in the second gap 174, i.e., the horizontal portion 226 of the channel 220, may be connected to a portion of the substrate 100 spaced apart therefrom by the third gap 280 in the second direction.

However, in some embodiments, instead of the first epitaxial layer 300 formed by the SEG process, a process for depositing a layer including a metal and/or a metal silicide may be performed to form a metal layer and/or a metal silicide layer on the horizontal portion 226 of the channel 220 to fill the third gap 280.

Figure 17:
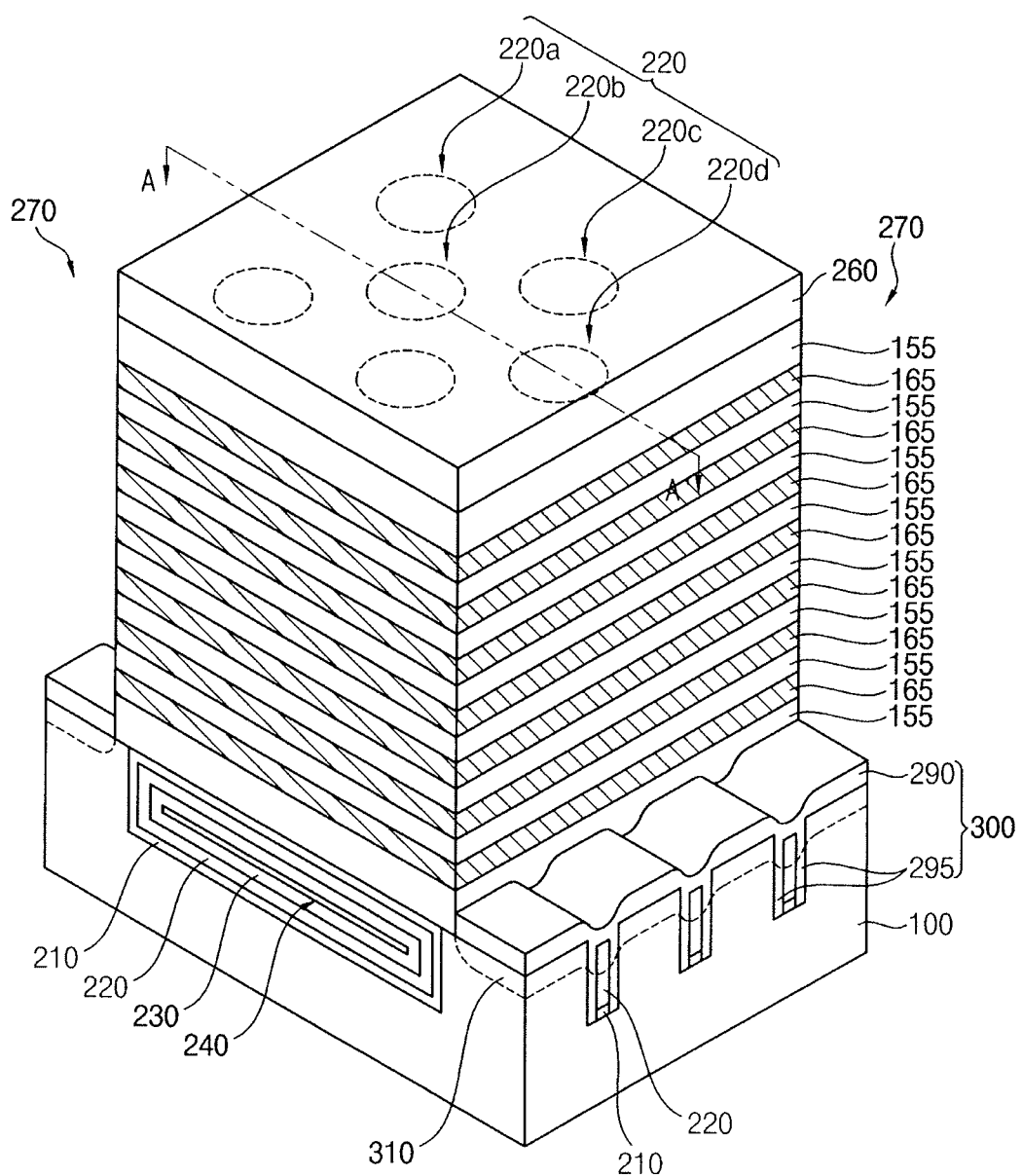
Figure 18:
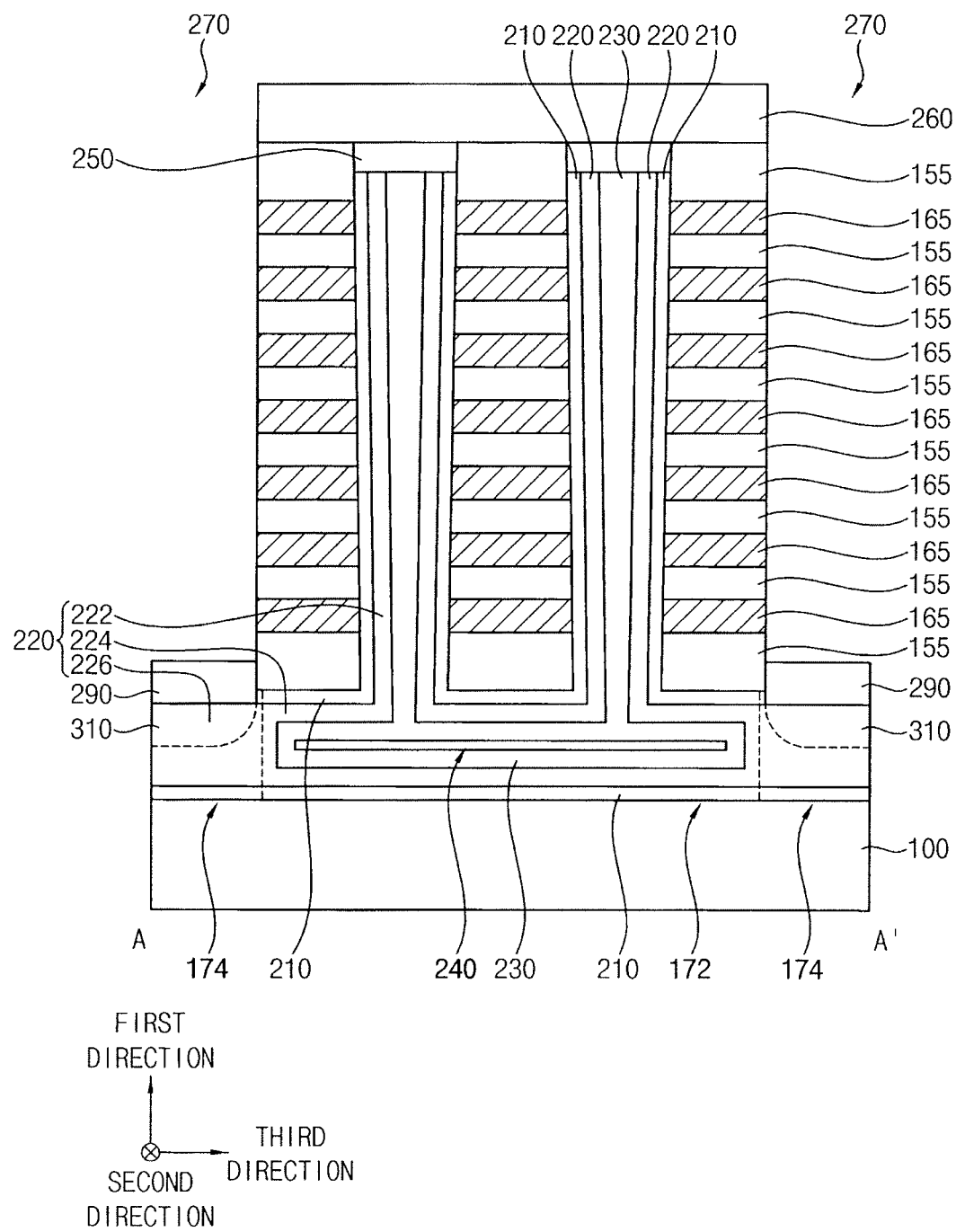
Figure 19:
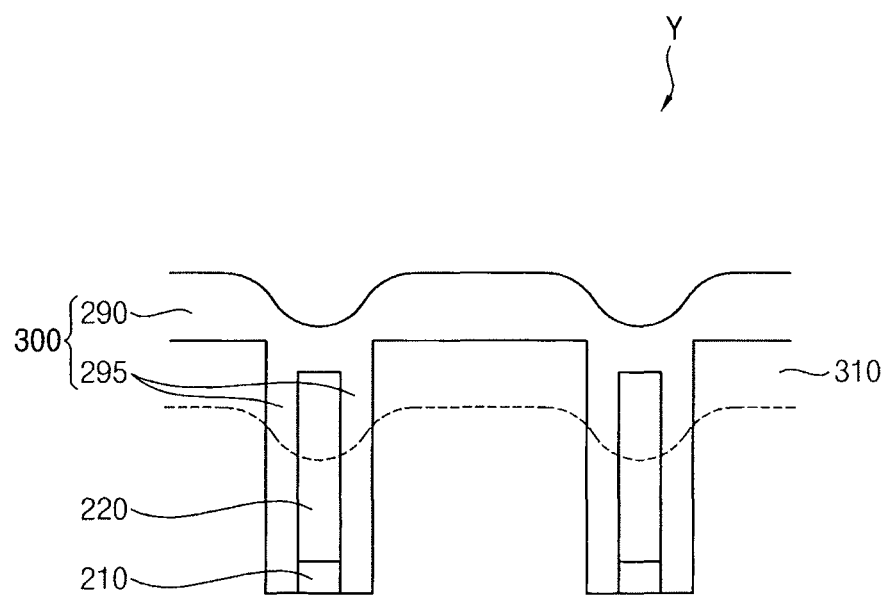

Referring to FIGS. 17 to 19, impurities may be implanted into a portion of the first epitaxial layer 300 to form a first source region 310.

In example embodiments, the impurities may be implanted into an upper portion of the first epitaxial layer 300, i.e., into the first portion 290 of the first epitaxial layer 300 and an upper portion of the second portion 295 thereof (e.g., to form a source intersecting tops of the fin channels). The impurities may be also implanted into an upper portion of the horizontal portion 226 of the channel 220 and an upper portion of the substrate 100, which may be adjacent to the upper portion of the second portion 295 of the channel 220 in the second direction. Accordingly, the first source region 310 may be formed at the upper portion of the first epitaxial layer 300, the upper portion of the horizontal portion 226 of the channel 220, and the upper portion of the substrate 100. According to the profile of the upper surface of the first epitaxial layer 300, the profile of a lower surface of the first source region 310 may also have a shape that may not be flat but curved.

In other embodiments, the first source region 310 may be formed after a process for forming a gate electrode which will be described later.

Figure 20:
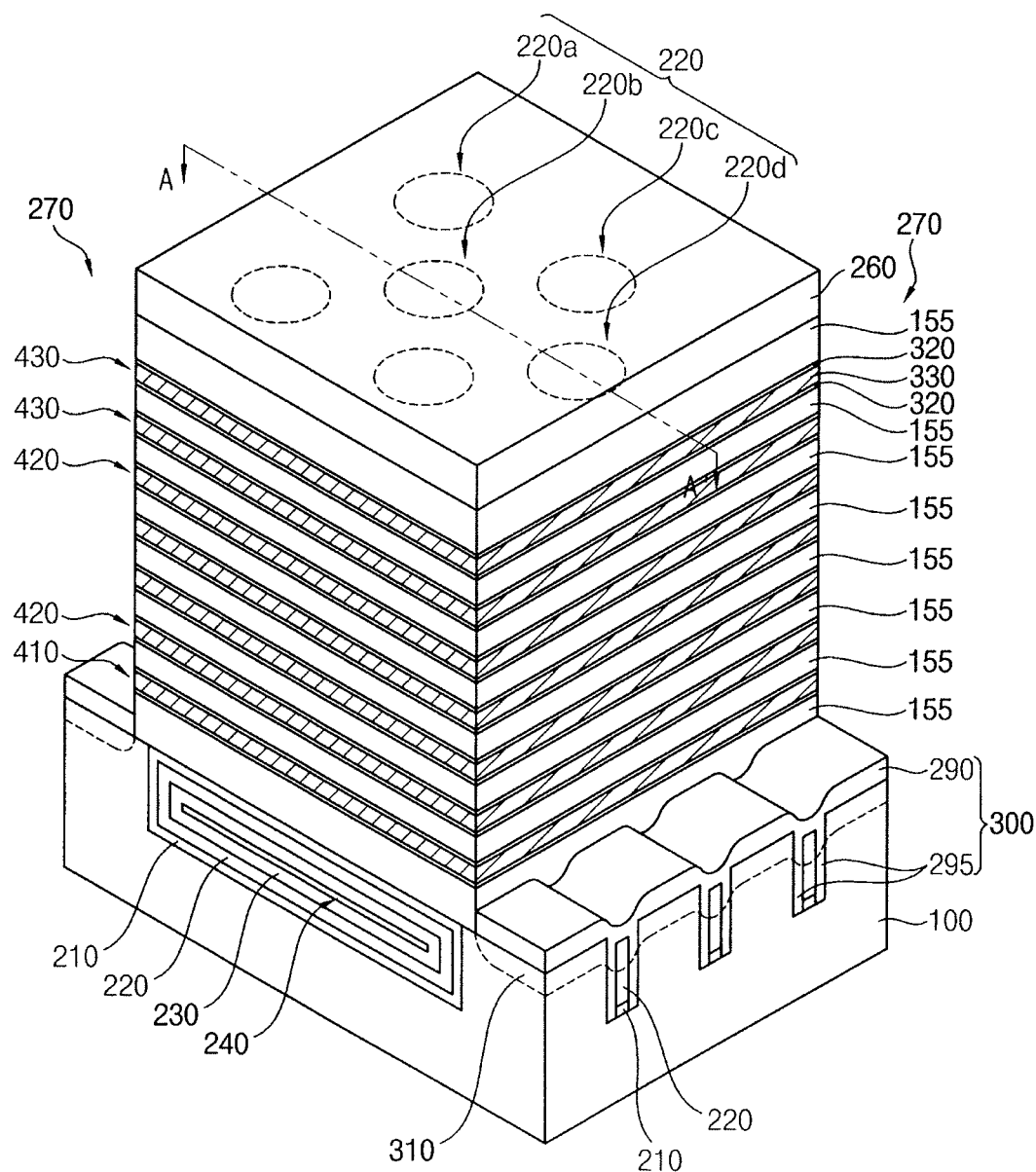
Figure 21:
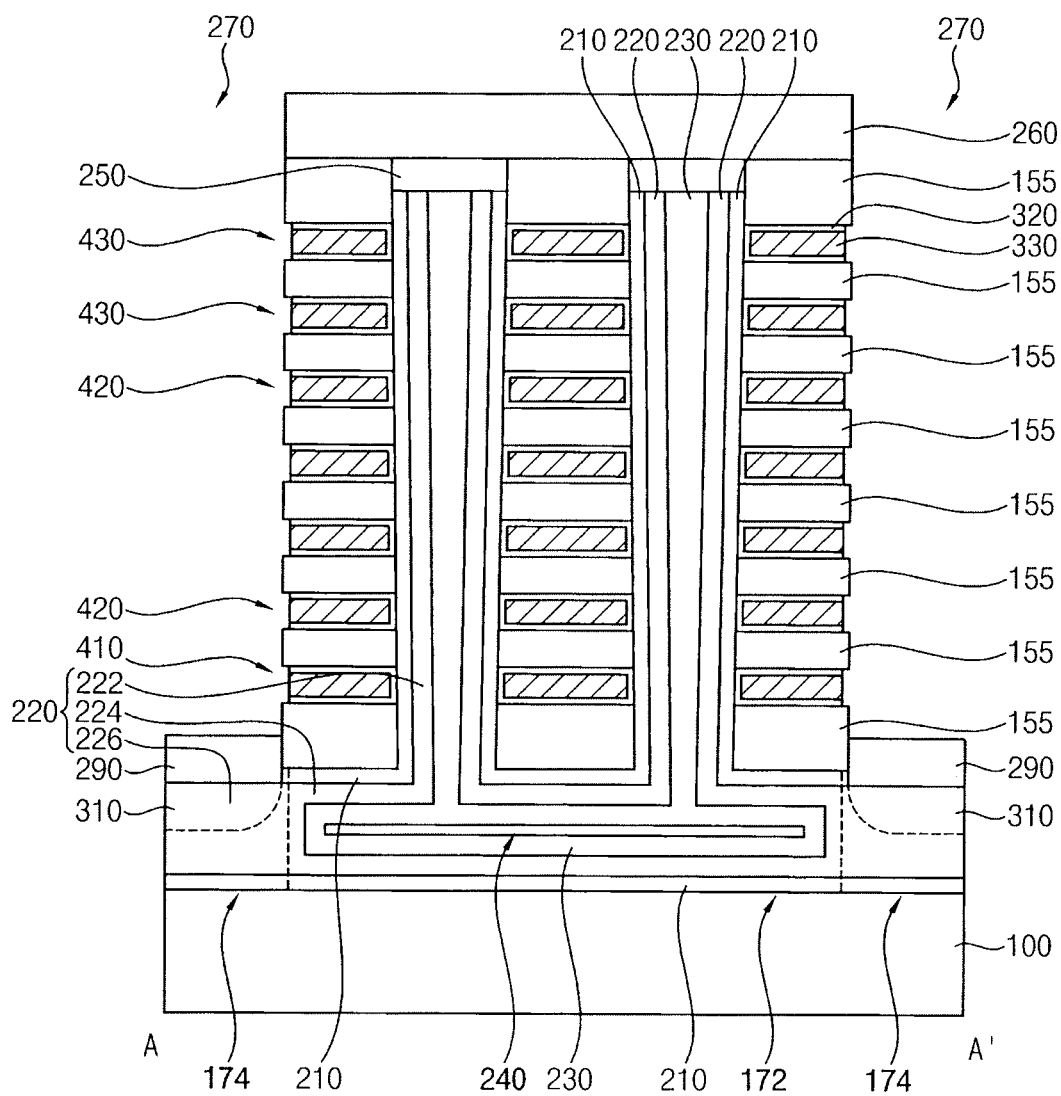

Referring to FIGS. 20 and 21, the second sacrificial pattern 165 of which a sidewall is exposed by the first opening 270 may be removed to form a fourth gap, and a second blocking pattern 320 and a gate conductive pattern 330 may be formed in the fourth gap. In example embodiments, the second sacrificial pattern 165 exposed by the first opening 270 may be removed by a wet etching process using an etchant including phosphoric acid or sulfuric acid.

In example embodiments, after forming a second blocking layer on an outer sidewall of the first blocking pattern 180 exposed by the fourth gap, an inner wall of the fourth gap, a surface of the insulation pattern 155, and an upper surface of the first insulating interlayer 260, a gate conductive layer may be formed on the second blocking layer to fill a remaining portion of the fourth gap. The gate conductive layer and the second blocking layer may be partially removed to form the gate conductive pattern 330 and the second blocking pattern 320, respectively, in the fourth gap.

In example embodiments, the gate conductive layer and the second blocking layer may be partially removed by a wet etching process, and the gate conductive pattern 330 and the second blocking pattern 320 may be formed to fill the fourth gap partially or entirely. In one embodiment, the second blocking pattern 320 may be formed not only in the fourth gap, but also on a sidewall of the insulation pattern 155 exposed by the first opening 270.

A barrier pattern may be further formed between the second blocking pattern 320 and the gate conductive pattern 330, and the gate conductive pattern 330 and the barrier pattern may form a gate electrode. In example embodiments, the gate electrode may extend in the second direction, and a plurality of gate electrodes may be formed in the third direction.

In example embodiments, the gate electrodes may be formed at a plurality of steps, respectively, spaced apart from each other in the first direction, and the gate electrodes at the plurality of steps may form a gate electrode structure. The gate electrode structure may include at least one first gate electrodes 410, a plurality of second gate electrodes 420, and at least one third gate electrodes 430 sequentially stacked from the upper surface of the substrate 100 in the first direction. The number of the steps at which the first to third gate electrodes 410, 420 and 430 are formed may be varied depending on the number of steps of the second sacrificial pattern 165.

Referring again to FIGS. 1 to 4, after forming a spacer layer on a sidewall of the first opening 270, an upper surface of the first epitaxial layer 300, and an upper surface of the first insulating interlayer 260, the spacer layer may be anisotropically etched to form the spacer 340 on the sidewall of the first opening 270.

After forming a conductive layer on the spacer 340 and the first insulating interlayer 260 to fill a remaining portion of the first opening 270, the conductive layer may be planarized until the upper surface of the first insulating interlayer 260 may be exposed, and the common source line (CSL) 350 may be formed. In example embodiments, the CSL 350 may extend in the first direction, and may also extend in the second direction. Upper insulating interlayers, contact plugs, and upper wirings extending therethrough may be further formed to complete the fabrication of the vertical memory device.

As described above, the first sacrificial pattern 140 filling the trench structure 120 at the upper portion of the substrate 100 may be removed via the channel hole 170, which extends through the mold and is connected to the first and second gaps 172 and 174, and the charge storage structure 210 and the channel 220 may be formed in the channel hole 170 and the first and second gaps 172 and 174 (to fill the cavity formed therein by the removed first sacrificial pattern 140). Also, after removing the portion of the charge storage structure 210 in the second gap 174 exposed by the first opening 270 to form the third gap 280 exposing the horizontal portion 226 of the channel 220, a SEG process may be performed to form the first epitaxial layer 300 filling the third gap 280, which may connect the channel 220 to the substrate 100.

Accordingly, there is no need to use an additional spacer for partially removing the charge storage structure 210 in the channel hole 170 to expose the upper surface of the substrate 100 so that the channel 220 may contact the exposed upper surface of the substrate 100. Thus, the channel hole 170 may not be formed in a large size so that the channel 220 may be well connected to the substrate 100, and the vertical memory device may have a high integration degree.

The upper portion of the first epitaxial layer 300, the upper portion of the horizontal portion 226 of the channel 220, and the upper portion of the substrate 100 may be doped with impurities to serve as the first source region 310, and may be electrically connected to the CSL 350 thereon. That is, the upper portion of the horizontal portion 226 of the channel 220 may be connected to the CSL 350, and a lower portion thereof may be connected to the substrate 100.

Figure 22:
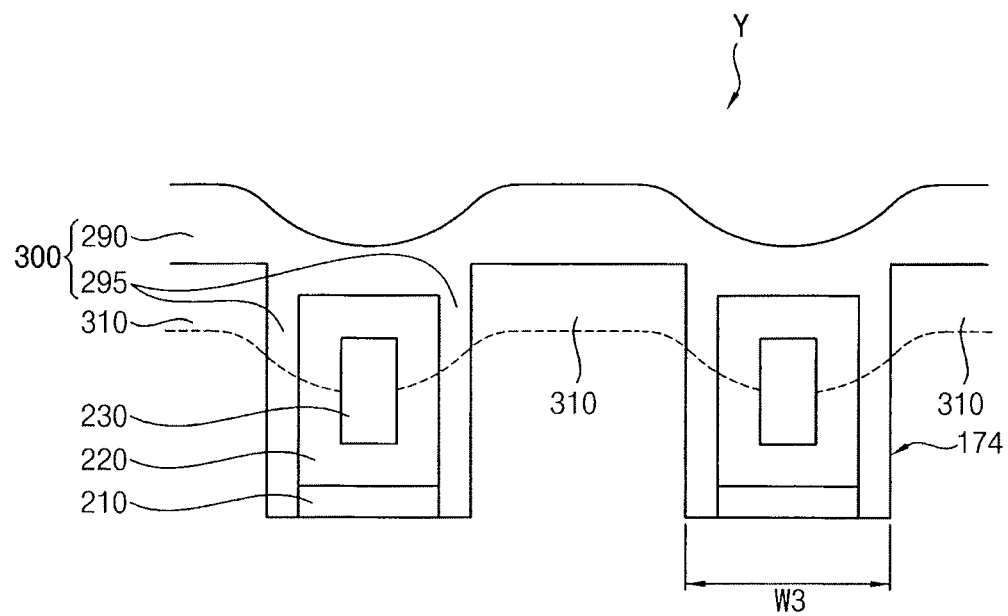
FIGS. 22 and 23 illustrate side views of region Y of FIG. 1 in accordance with example embodiments.
Figure 23:
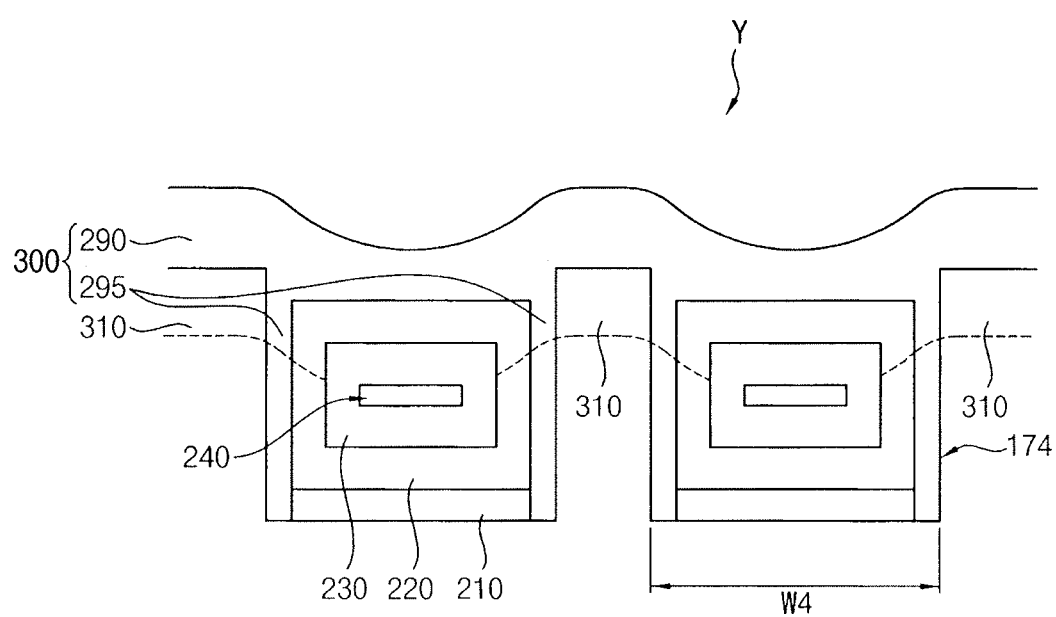

FIGS. 22 and 23 are side views of region Y of FIG. 1 illustrating a vertical memory device in accordance with example embodiments. This vertical memory device may be substantially the same as or similar to the vertical memory device described with reference to FIGS. 1 to 4, except for structures in the second gap 174. Accordingly, like reference numerals refer to like elements, and detailed descriptions thereof are omitted herein.

Referring to FIG. 22, the second gap 174 may have a third width W3 in the second direction, which may be greater than the second width W2. Accordingly, not only the charge storage structure 210 and the channel 220 sequentially stacked may be formed in the second gap 174, but also the filling pattern 230 may be formed in an inner space formed by the channel 220. However, the first source region 310, which may be formed by doping impurities into the upper portion of the first epitaxial layer 300, the upper portion of the horizontal portion 226 of the channel 220, and the upper portion of the substrate 100, may not be formed in the filling pattern 230 including an insulation material.

Referring to FIG. 23, the second gap 174 may have a fourth width W4 in the second direction, which may be greater than the third width W3. Accordingly, not only the charge storage structure 210 and the channel 220 sequentially stacked may be formed in the second gap 174, but also the filling pattern 230 may be formed in an inner space formed by the channel 220, and further, a second air gap 245 may be formed in an inner space formed by the filling pattern 230. However, the first source region 310 may be formed neither in the filling pattern 230 including an insulation material nor in the second air gap 245 including air.

Figure 24:
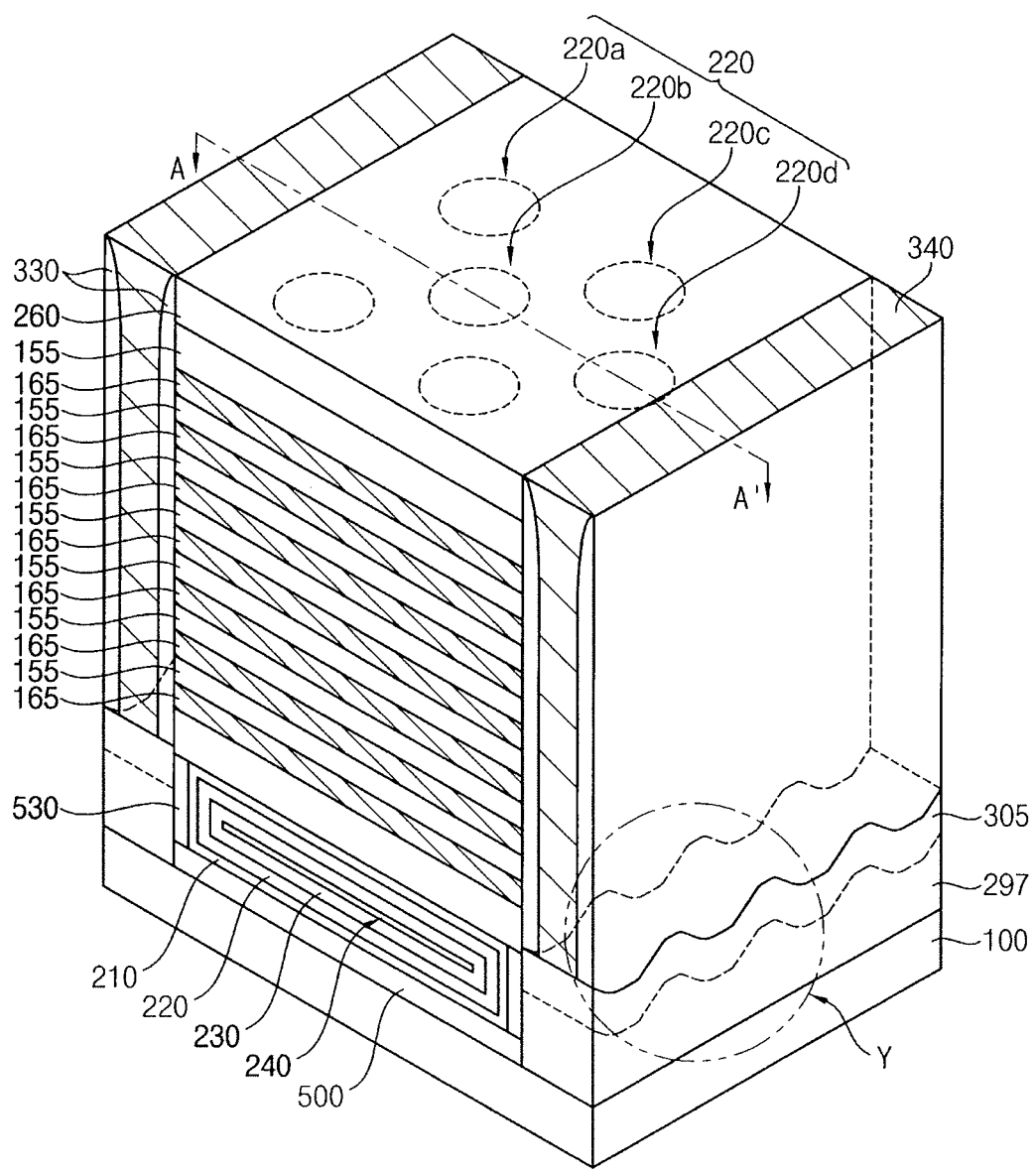
FIG. 24 illustrates a perspective view of a vertical memory device in accordance with example embodiments.
Figure 25:
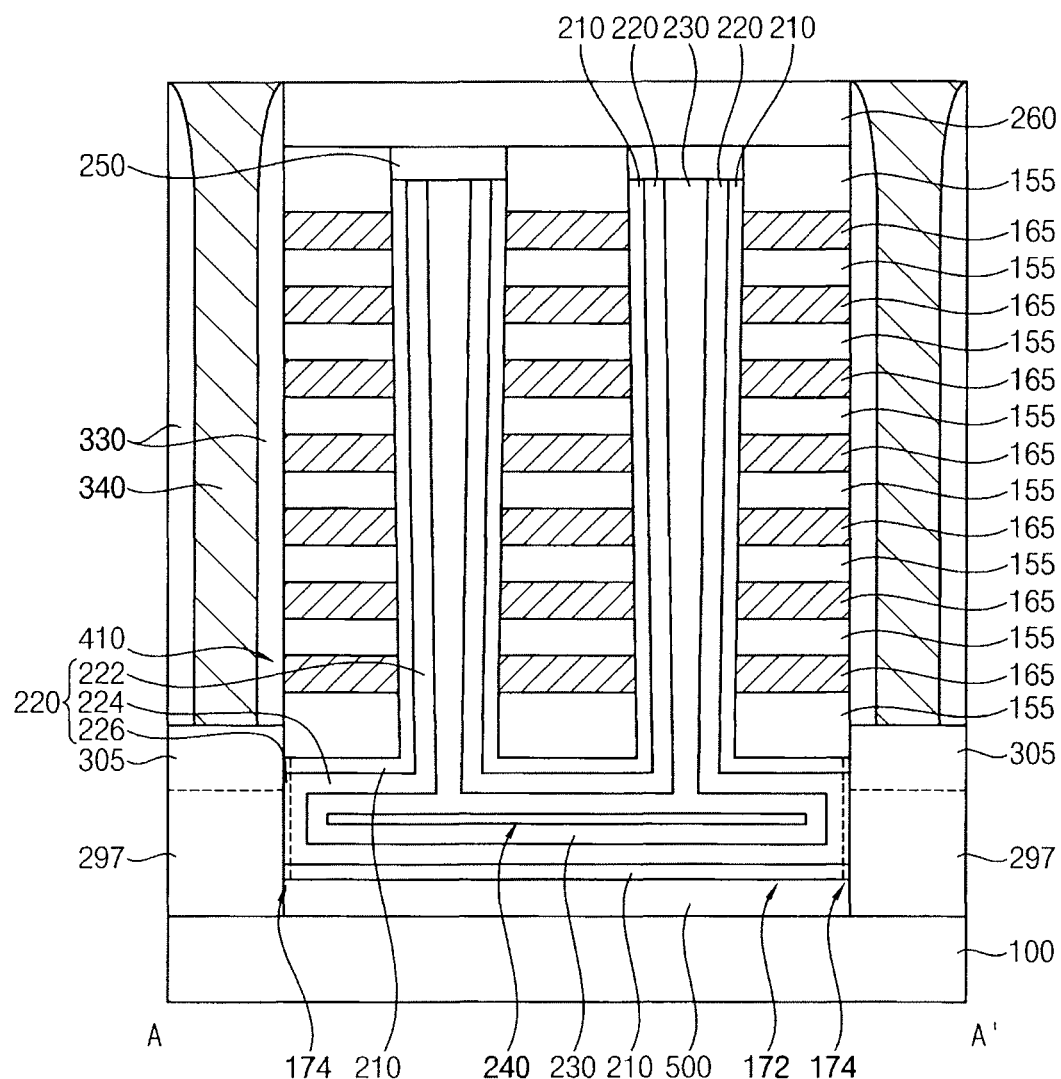
FIG. 25 illustrates a cross-sectional view taken along line A-A' of FIG. 24.
Figure 26:
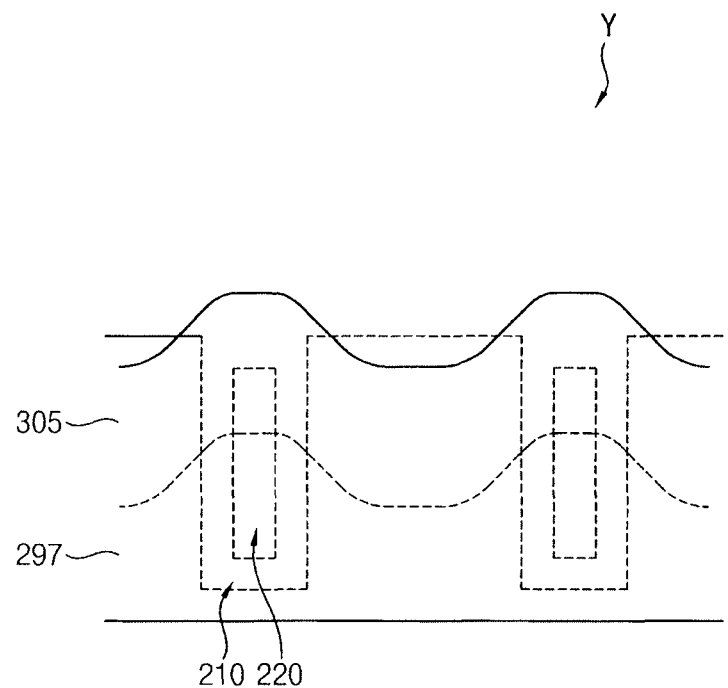
FIG. 26 illustrates a side view of region Y of FIG. 24.

FIG. 24 is a perspective view illustrating a vertical memory device in accordance with example embodiments, FIG. 25 is a cross-sectional view taken along line A-A' of FIG. 24, and FIG. 26 is a side view of region Y of FIG. 24. This vertical memory device may be substantially the same as or similar to the vertical memory device described with reference to FIGS. 1 to 4, except for some elements. Accordingly, like reference numerals refer to like elements, and detailed descriptions thereof are omitted herein.

Referring to FIGS. 24 to 26, the vertical memory device may further include a first etch stop layer 500 and a second insulating interlayer 530 sequentially stacked on the substrate 100. The first etch stop layer 500 may include a metal oxide, e.g., aluminum oxide, and the second insulating interlayer 530 may include an insulation material, e.g., silicon oxide.

The first and second gaps 172 and 174 containing the plate 224 and the horizontal portion 226, respectively, of the channel 220 therein may be formed through the second insulating interlayer 530. Portions of the horizontal portion 226 of the channel 220 and the charge storage structure 210 in each of the second gaps 174, which may be overlapped with the gate electrodes in the first direction, may be removed so that only quite a small length in the third direction may remain.

The second epitaxial layer 297 may be formed on the substrate 100 to extend in the second direction, and an upper surface of the second epitaxial layer 297 may have a non-uniform height in the second direction. Accordingly, the second epitaxial layer 297 may have an upper surface that may not be flat but curved in the second direction. In one embodiment, an upper surface of a portion of the second epitaxial layer 297 adjacent to the horizontal portion 226 of the channel 220 in the third direction may be higher than that of a portion of the upper surface of the second epitaxial layer 297 adjacent to the second insulating interlayer 530 in the third direction.

The second epitaxial layer 297 may contact a sidewall of the horizontal portion 226 of the channel 220, and thus the horizontal portion 226 of the channel 220 may be connected to the substrate 100. An upper portion of the second epitaxial layer 297 may be doped with impurities to form a second source region 305.

FIGS. 27 to 30 are perspective views illustrating stages of a method of manufacturing a vertical memory device in accordance with example embodiments. This method of manufacturing the vertical memory device may include processes substantially the same as or similar to the processes described with reference to FIGS. 5 to 21 and FIGS. 1 to 4. Accordingly, detailed descriptions thereof are omitted herein.

Figure 27:
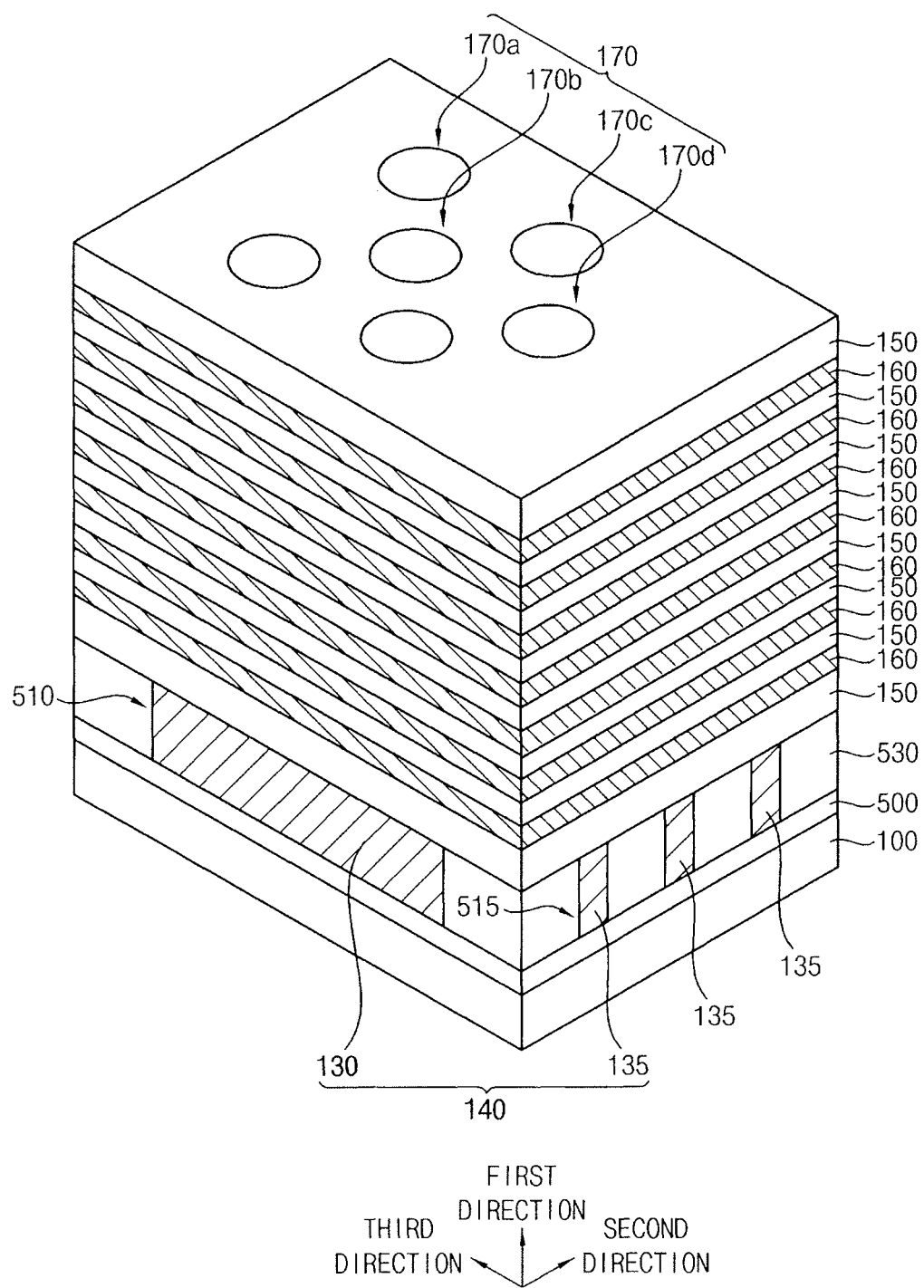
FIGS. 27 to 30 illustrate perspective views of stages in a method of manufacturing a vertical memory device in accordance with example embodiments.

Referring to FIG. 27, processes substantially the same as or similar to the processes described with reference to FIGS. 5 to 8 may be performed.

However, the first etch stop layer 500 and the second insulating interlayer 530 may be further formed on the substrate 100, and the first sacrificial pattern 140 may not be formed in the trench structure 120 at the upper portion of the substrate 100, but may be formed in second and third openings 510 and 515 extending through the second insulating interlayer 530 to expose an upper surface of the first etch stop layer 500. The second and third openings 510 and 515 may have shapes corresponding to those of the first and second trenches 110 and 115, respectively, of the trench structure 120 illustrated in FIG. 5.

Figure 28:
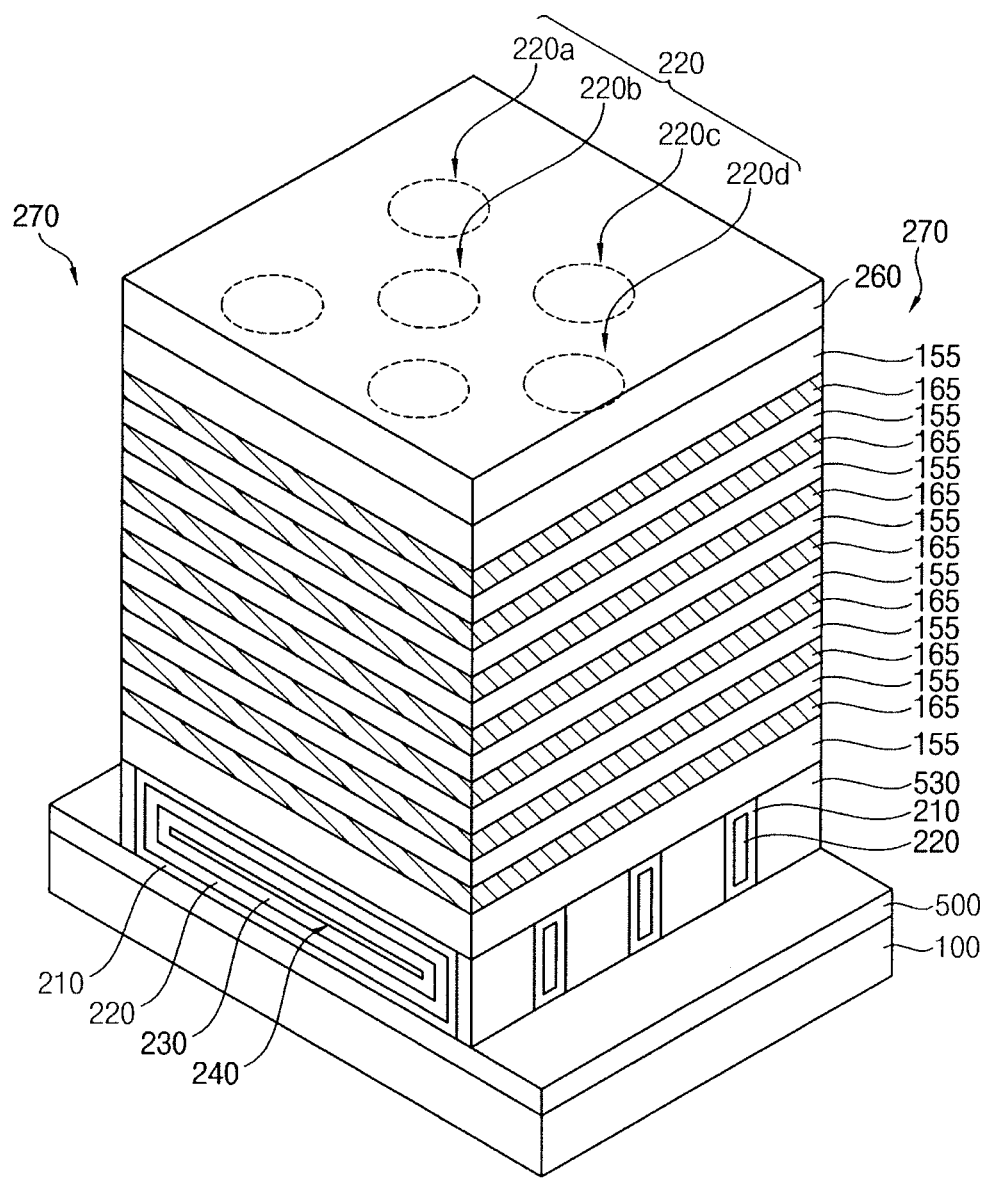
Figure 28:
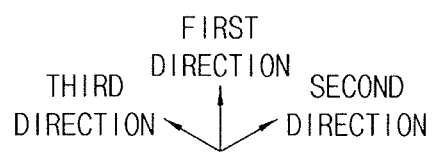

Referring to FIG. 28, processes substantially the same as or similar to the processes described with reference to FIGS. 9 to 13 may be performed.

However, when the first opening 270 is formed, not only the first insulating interlayer 260 and the mold, but also portions of the charge storage structure 210 and the horizontal portion 226 of the channel 220 in each of the second gaps 174 under the mold, and a portion of the second insulating interlayer 530 adjacent thereto in the second direction may be removed. Accordingly, an upper surface of the first etch stop layer 500 may be exposed by the first opening 270, and sidewalls of the horizontal portion 226 of the channel 220 and the charge storage structure 210 may also be exposed.

Figure 29:
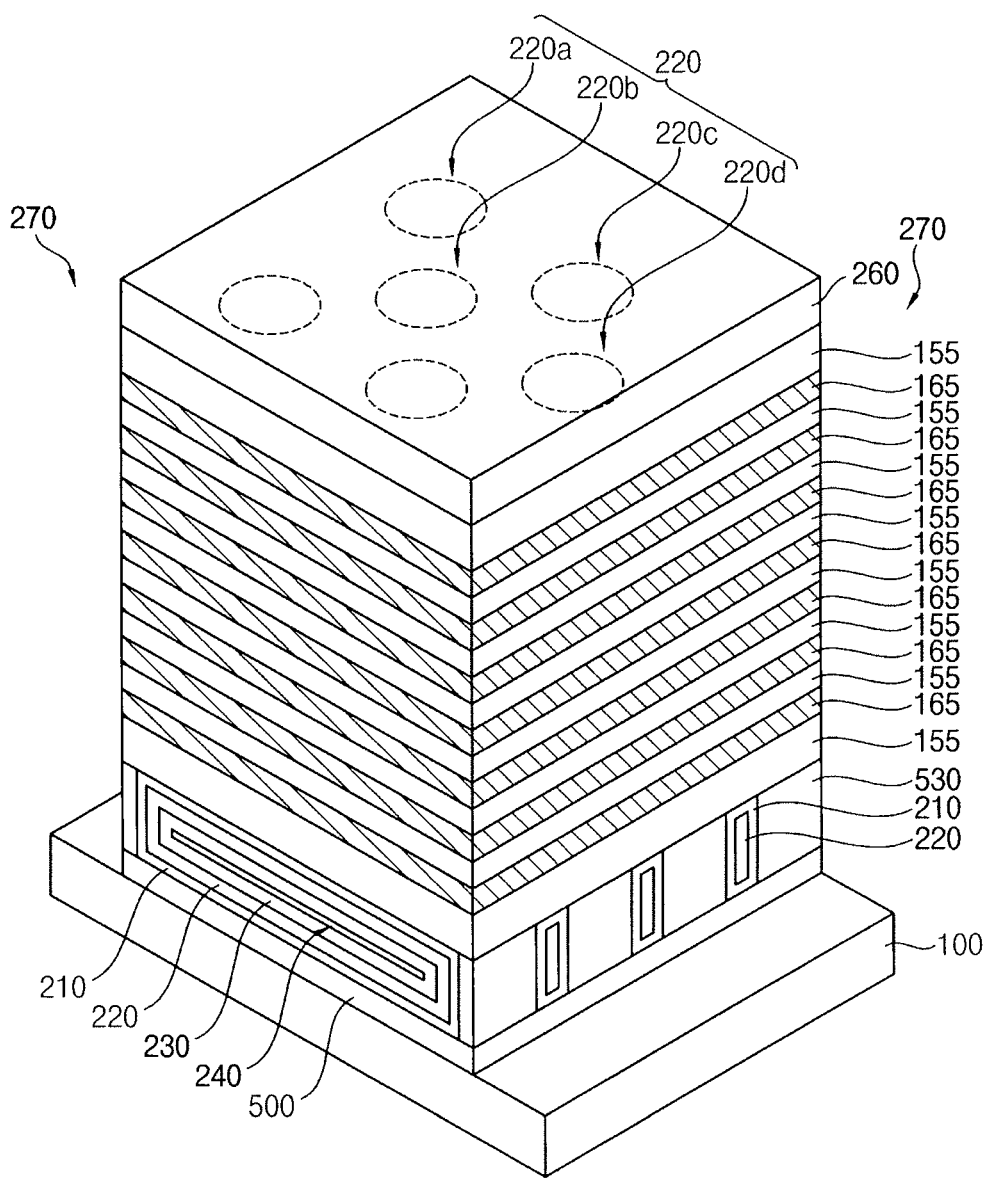
Figure 29:
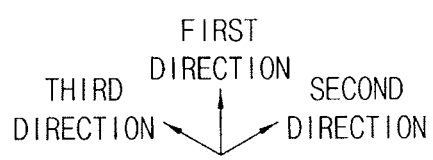

Referring to FIG. 29, the exposed portion of the first etch stop layer 500 may be removed to expose an upper surface of the substrate 100 thereunder.

Figure 30:
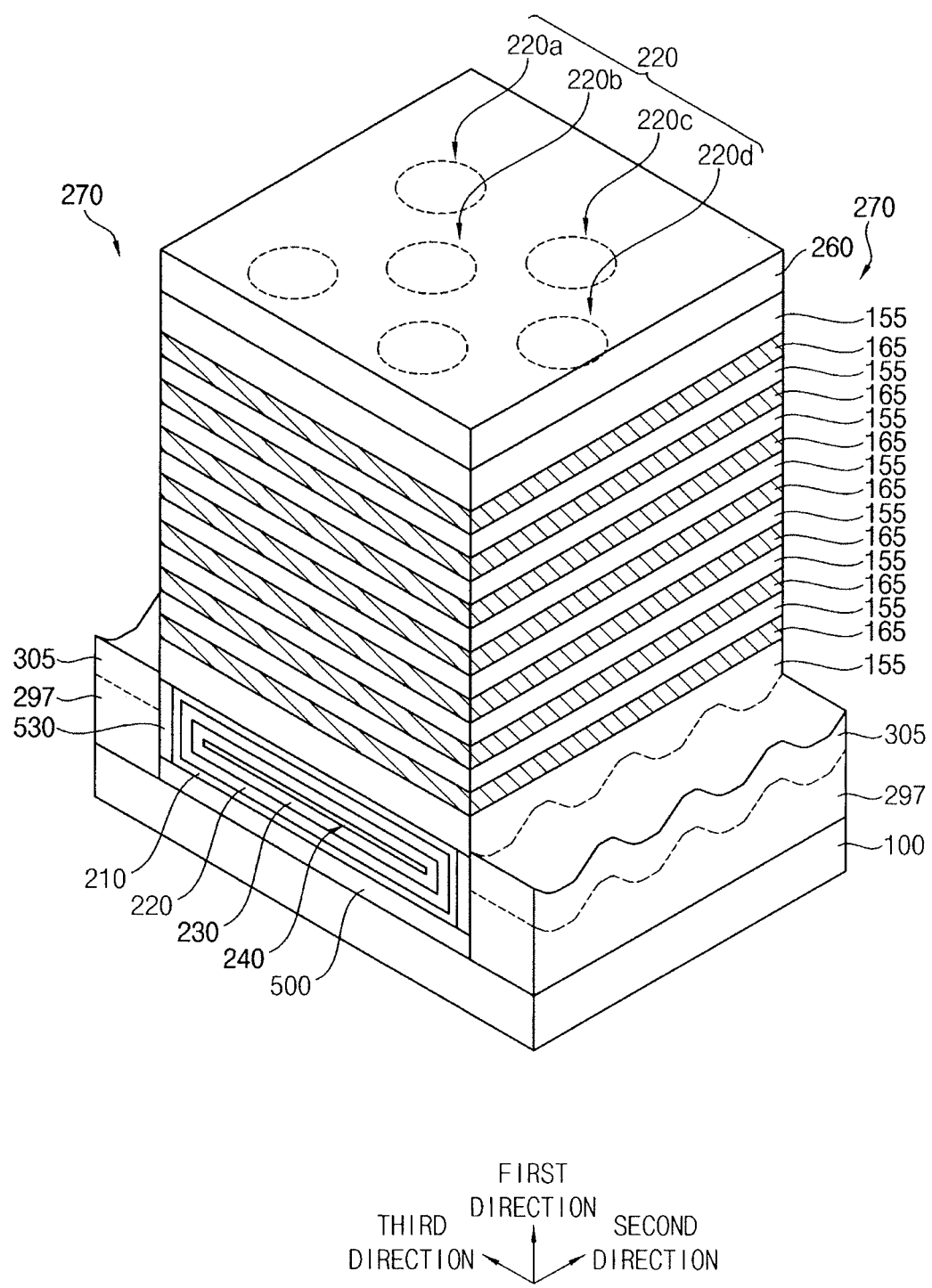

Referring to FIG. 30, processes substantially the same as or similar to the processes described with reference to FIGS. 14 to 19 may be performed.

Accordingly, a SEG process may be performed using the exposed upper surface of the substrate 100 and the horizontal portion 226 of the channel 220 exposed by the first opening 270 as a seed to form a second epitaxial layer 297 on the substrate 100.

The second epitaxial layer 297 may extend in the second direction. In example embodiments, an upper surface of the second epitaxial layer 297 may have a non-uniform height in the second direction, and thus the second epitaxial layer 297 may have an upper surface that may not be flat but curved in the second direction. In one embodiment, an upper surface of a portion the second epitaxial layer 297 adjacent to the horizontal portion 226 of the channel 220 in the third direction may be higher than that of a portion of the second epitaxial layer 297 adjacent to the second insulating interlayer 530 in the third direction.

Due to the formation of the second epitaxial layer 297, the sidewall of the horizontal portion 226 of the channel 220 exposed by the first opening 270 may be connected to a portion of the substrate 100 under the second epitaxial layer 297. An upper portion of the second epitaxial layer 297 may be doped with impurities to form a second source region 305.

Figure 31:
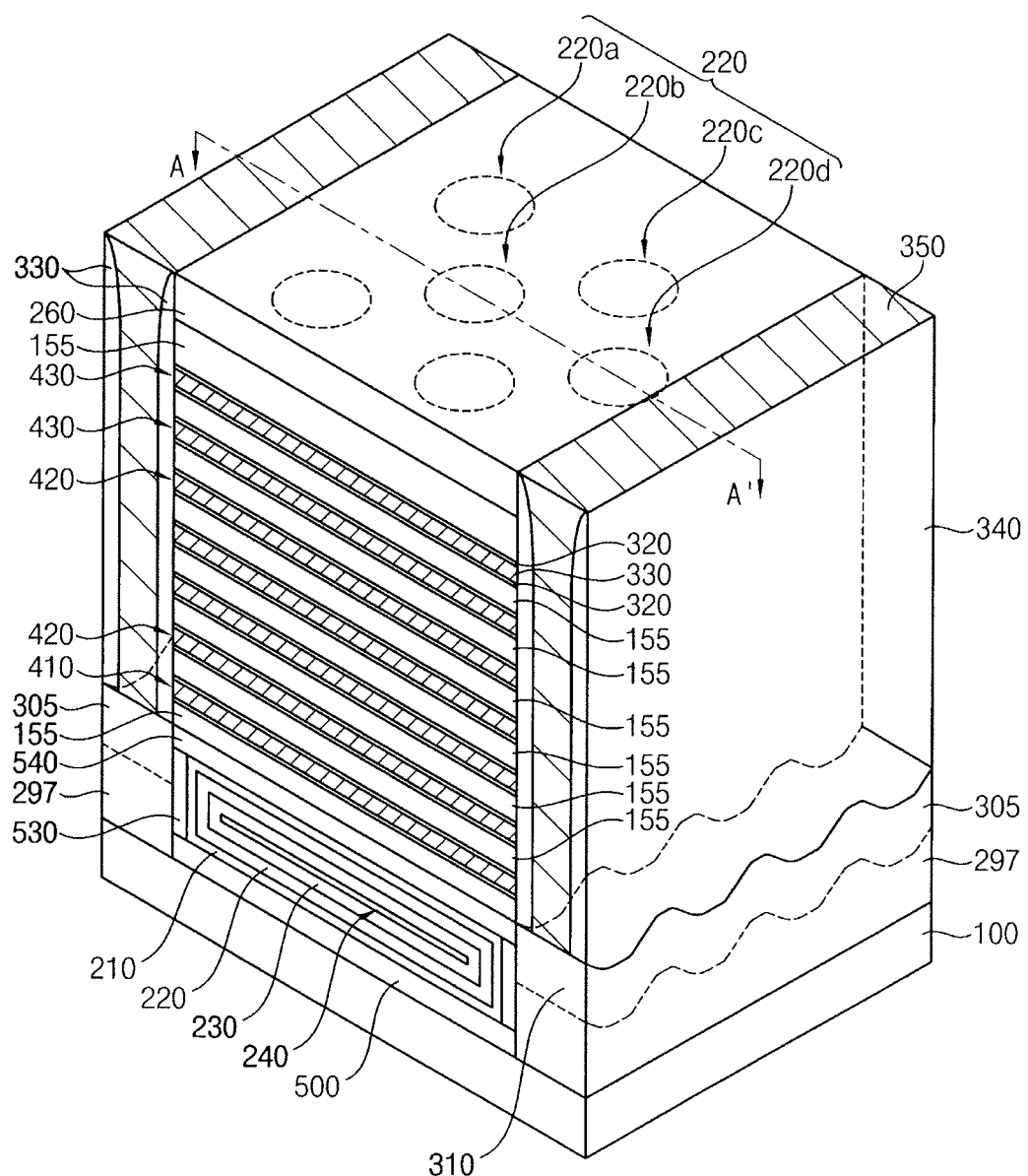
FIG. 31 illustrates a perspective view of a vertical memory device in accordance with example embodiments.
Figure 31:
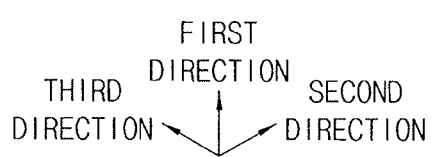

Referring again to FIGS. 24 to 26, processes substantially the same as or similar to the processes described with reference to FIGS. 20 to 21 and FIGS. 1 to 4 may be performed to complete the fabrication of the vertical memory device FIG. 31 is a perspective view illustrating a vertical memory device in accordance with example embodiments. This vertical memory device may be substantially the same as or similar to the vertical memory device described with reference to FIGS. 24 to 26, except for a second etch stop layer. Accordingly, like reference numerals refer to like elements, and detailed descriptions thereof are omitted herein.

Referring to FIG. 31, the vertical memory device may further include a second etch stop layer 540 between the second insulating interlayer 530 and the mold. The second etch stop layer 540 may include a metal oxide, e.g., aluminum oxide, and may serve as an etch stop layer when the first opening 270 is formed.

FIGS. 32 to 39 are plan views illustrating layouts of first sacrificial patterns used in a method of manufacturing a vertical memory device in accordance with example embodiments. The plan views illustrate layouts of first sacrificial patterns, channel holes and first openings. Extension portions included in each of the first sacrificial patterns may be exposed by the channel hole to be removed, and thus each of the extension portions spaced apart from each other may be partially overlapped with at least one of the channel holes in the first direction.

Figure 32:
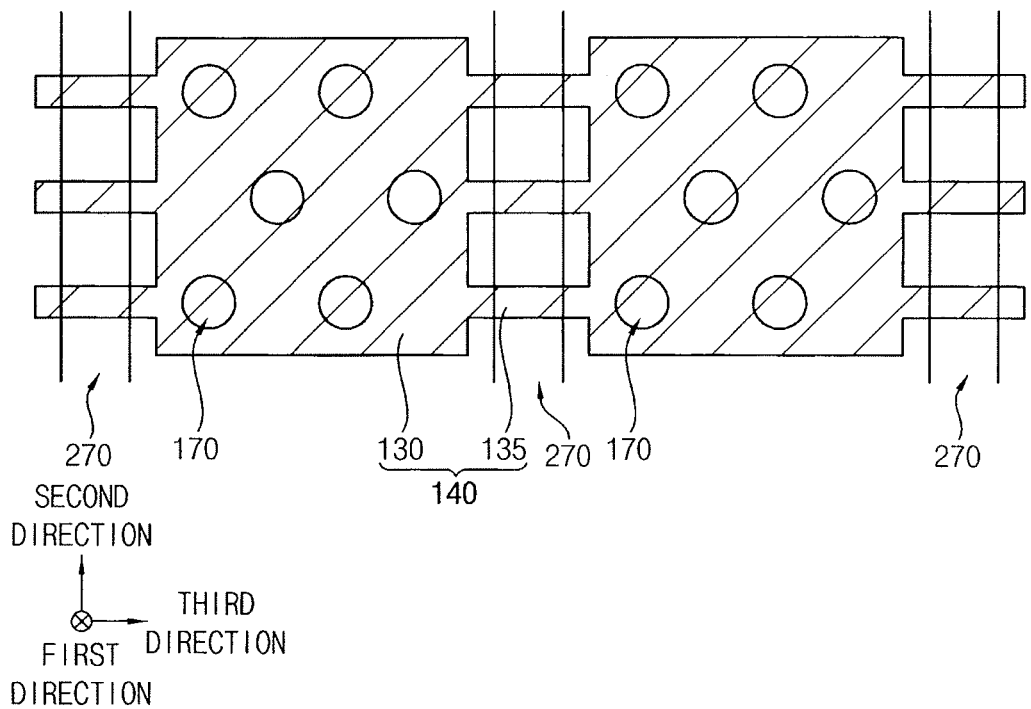
FIGS. 32 to 39 illustrate plan views of layouts of first sacrificial patterns used in a method of manufacturing a vertical memory device in accordance with example embodiments.

FIG. 32 illustrates a layout of the first sacrificial pattern 140 used in the method of manufacturing the vertical memory device described with reference to FIGS. 5 to 21. That is, the method of manufacturing the vertical memory device described with reference to FIGS. 5 to 21 has been illustrated using a portion of the first sacrificial pattern 140 between neighboring two first openings 270 in FIG. 32.

Figure 33:
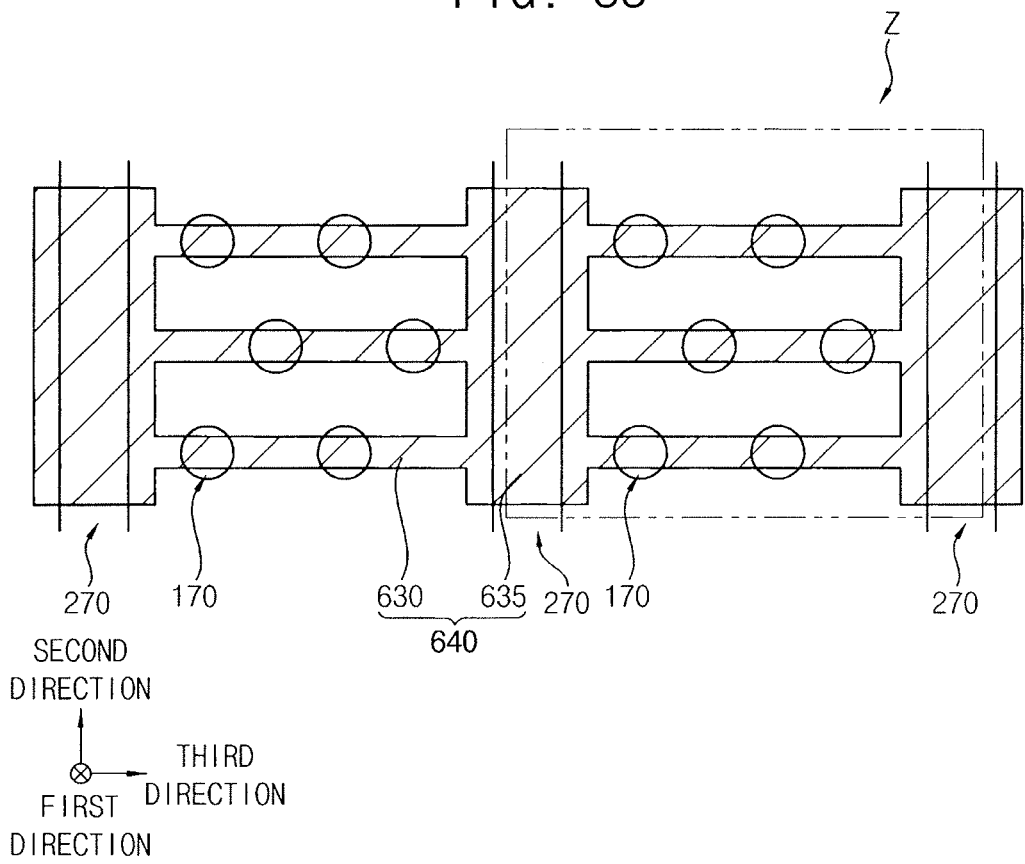

Referring to FIG. 33, a third sacrificial pattern 640 may include a plurality of third extension portions 630, each of which may extend in the third direction between the first openings 270 adjacent to each other in the third direction, disposed in the second direction, and a fourth extension portion 635 of which a central portion may be overlapped with each of the first openings 270 in the first direction and extending in the second direction.

Figure 34:
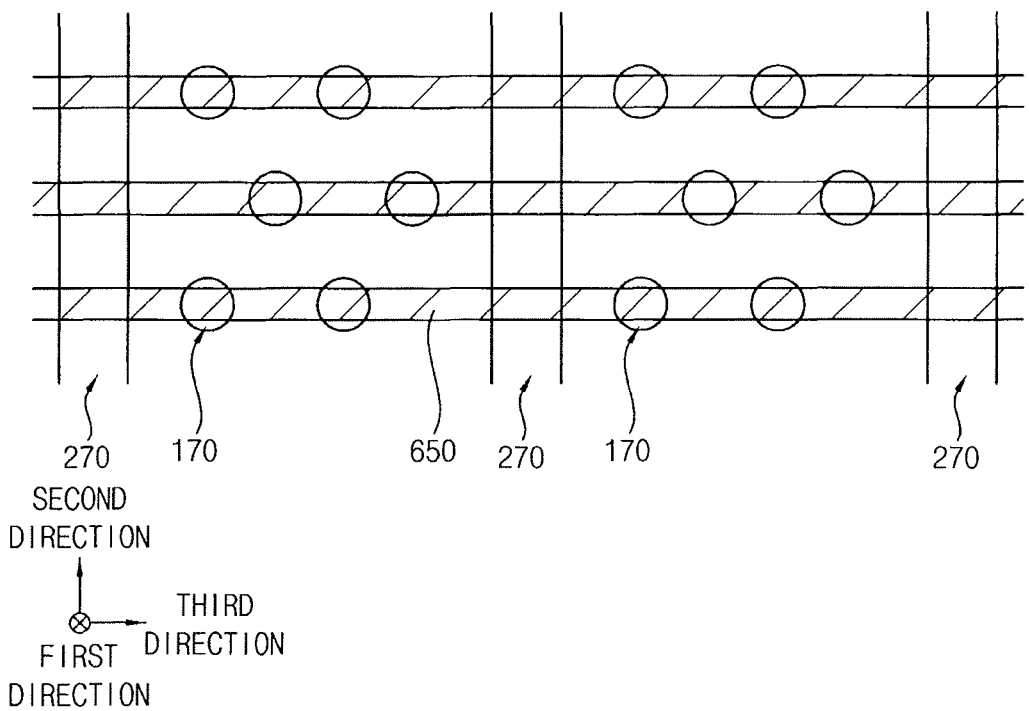

Referring to FIG. 34, a fourth sacrificial pattern may include a plurality of fifth extension portions 650, each of which may extend in the third direction, disposed in the second direction, and each of the first openings 270 may extend in the second direction to partially overlap the fifth extension portions 650 in the first direction.

Figure 35:
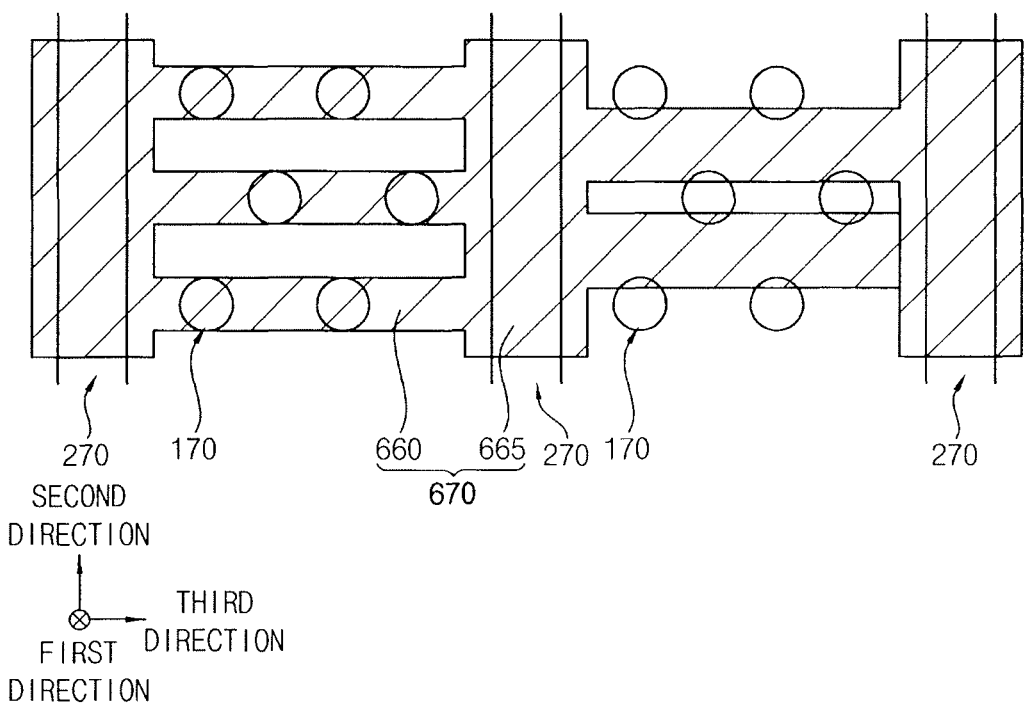

Referring to FIG. 35, a fifth sacrificial pattern 670 may include a plurality of sixth extension portions 660, each of which may extend in the third direction between the first openings 270 adjacent to each other in the third direction, disposed in the second direction, and a seventh extension portion 665 of which a central portion may be overlapped with each of the first openings 270 in the first direction and extending in the second direction. However, ones of the sixth extension portions 660 of the fifth sacrificial pattern in a first region I may not be aligned in the third direction with ones of the sixth extension portions 660 of the fifth sacrificial pattern in a second region II adjacent to the first region I in the third direction, and the sixth extension portions 660 of the fifth sacrificial pattern in the respective first and second regions I and II may be offset with each other in the second direction.

Figure 36:
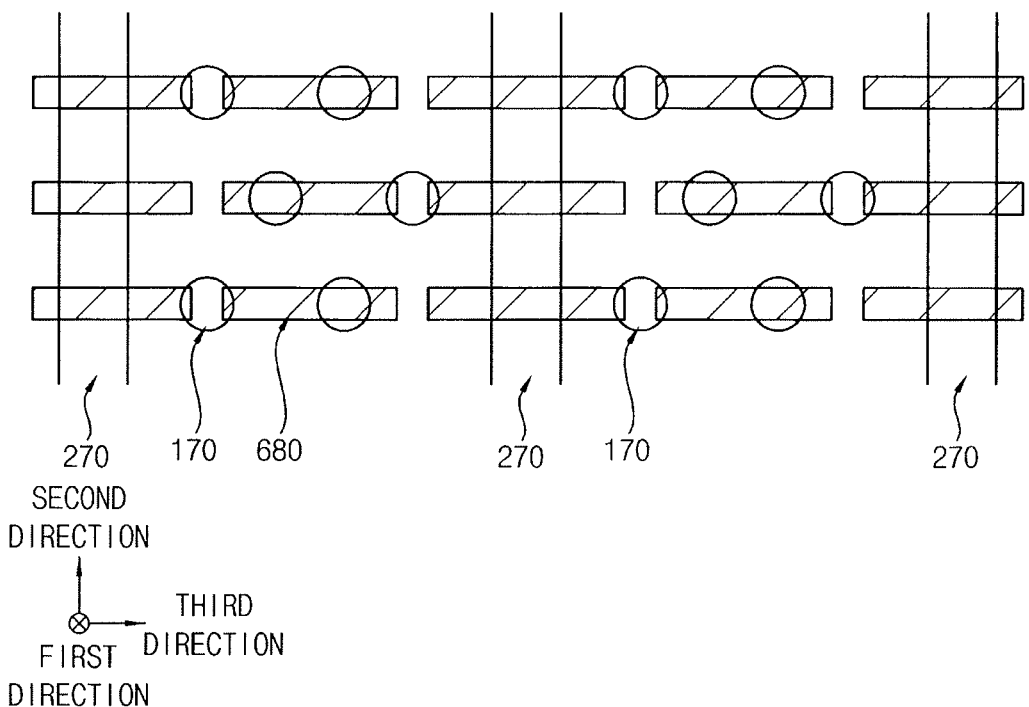

Referring to FIG. 36, a sixth sacrificial pattern may include a plurality of eighth extension portions 680, each of which may extend to a given length in the third direction, disposed in each of the second and third directions. Each of the first openings 270 may extend in the second direction to overlap central portions of the eighth extension portions 680 in the first direction. One of the eighth extension portions 680 may be disposed in the third direction between the first openings 270 neighboring with each other in the third direction.

Figure 37:
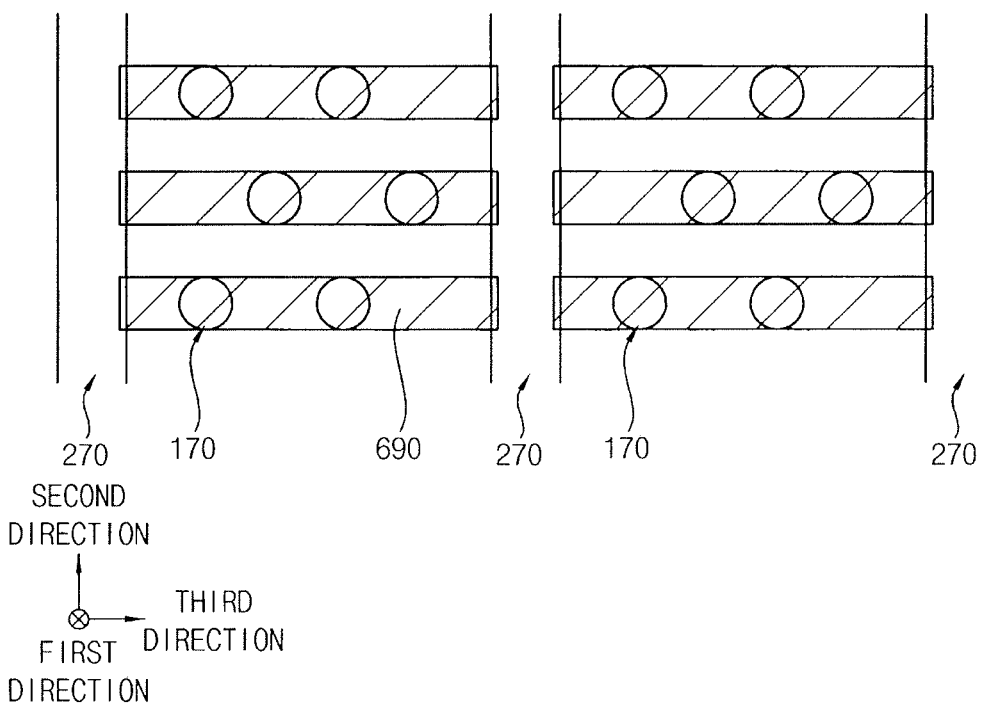

Referring to FIG. 37, a seventh sacrificial pattern may include a plurality of ninth extension portions 690, each of which may extend to a given length in the third direction, in each of the second and third directions. Each of the first openings 270 may extend in the second direction to overlap ends of the ninth extension portions 690 in the first direction. One of the ninth extension portions 690 may be disposed in the third direction between the first openings 270 neighboring with each other in the third direction.

Figure 38:
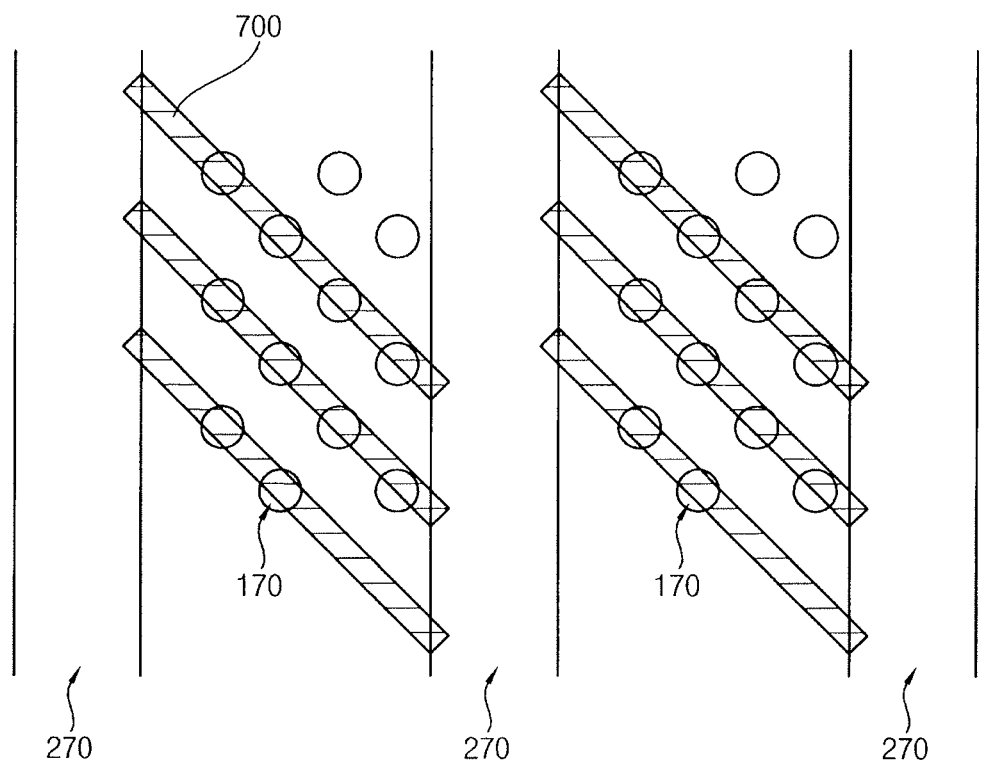

Referring to FIG. 38, an eighth sacrificial pattern may include a plurality of tenth extension portions 700, each of which may extend to a given length in a fourth direction having an acute angle with respect to the second direction, in each of the second and third directions. Each of the first openings 270 may extend in the second direction to overlap ends of the tenth extension portions 700 in the first direction. One of the tenth extension portions 700 may be disposed in the fourth direction between the first openings 270 neighboring with each other in the third direction.

Figure 39:
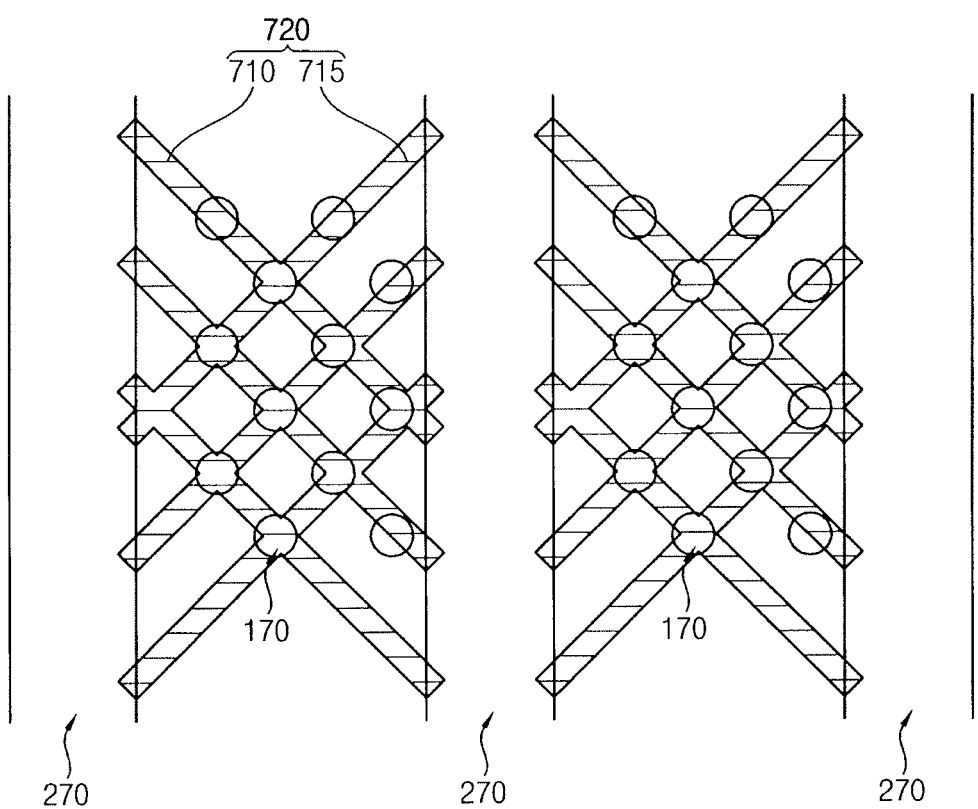

Referring to FIG. 39, a ninth sacrificial pattern may include a plurality of eleventh extension portions 710, each of which may extend to a given length in a fourth direction having an acute angle with respect to the second direction, disposed in each of the second and third directions, and a plurality of twelfth extension portions 715, each of which may extend to a given length in a fifth direction substantially perpendicular to the fourth direction, disposed in each of the second and third directions to partially overlap the eleventh extension portions 710. Each of the first openings 270 may extend in the second direction to overlap ends of the eleventh and twelfth extension portions 710 and 715 in the first direction. One of the eleventh extension portions 710 may be disposed in the fourth direction between the first openings 270 neighboring with each other in the third direction, and one of the twelfth extension portions 715 may be disposed in the fifth direction between the first openings 270 neighboring with each other in the third direction.

Figure 40:
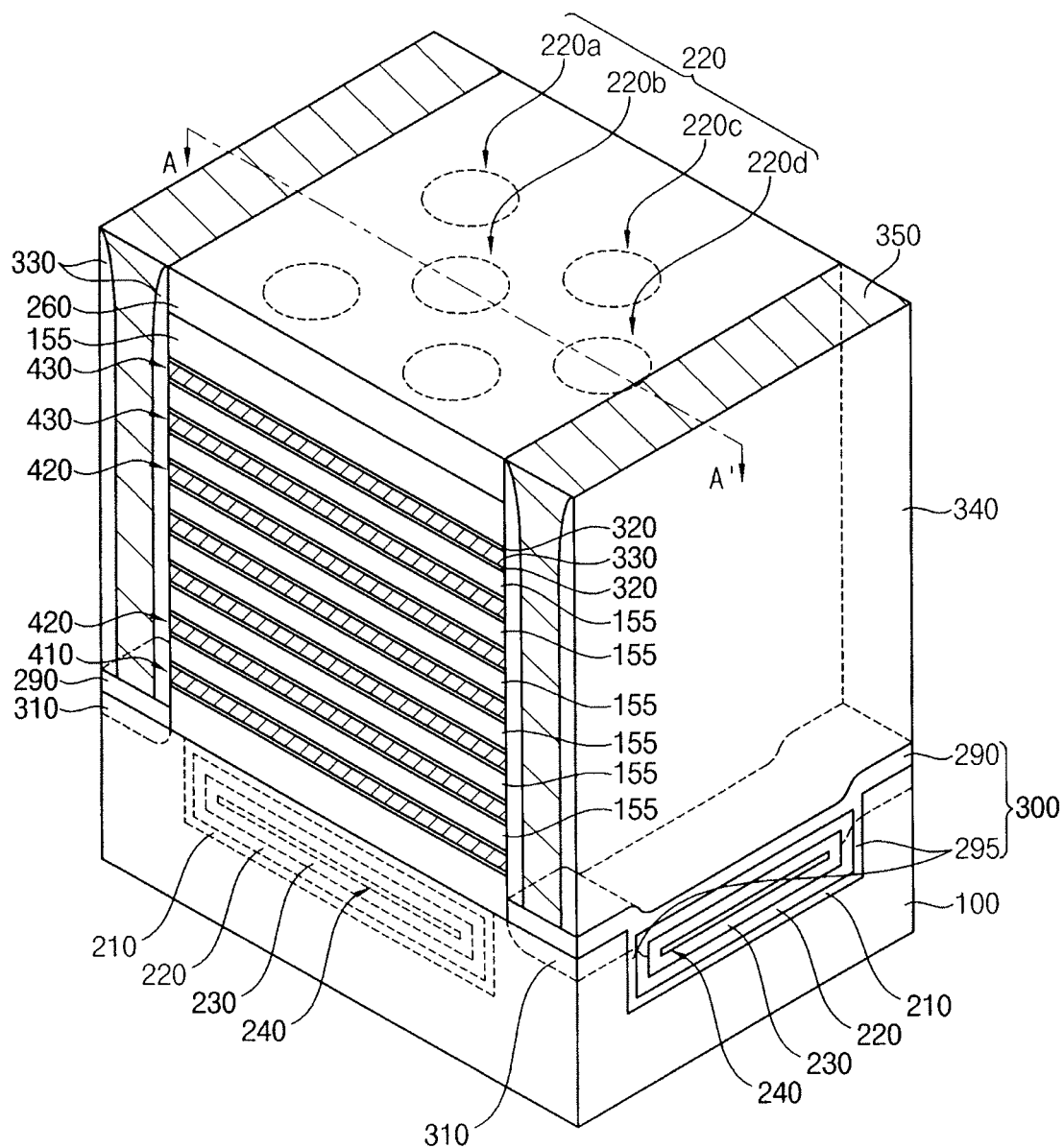
FIG. 40 illustrates a perspective view of a vertical memory device in accordance with example embodiments.
Figure 40:
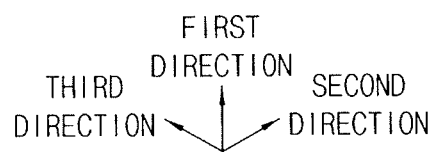
Figure 41:
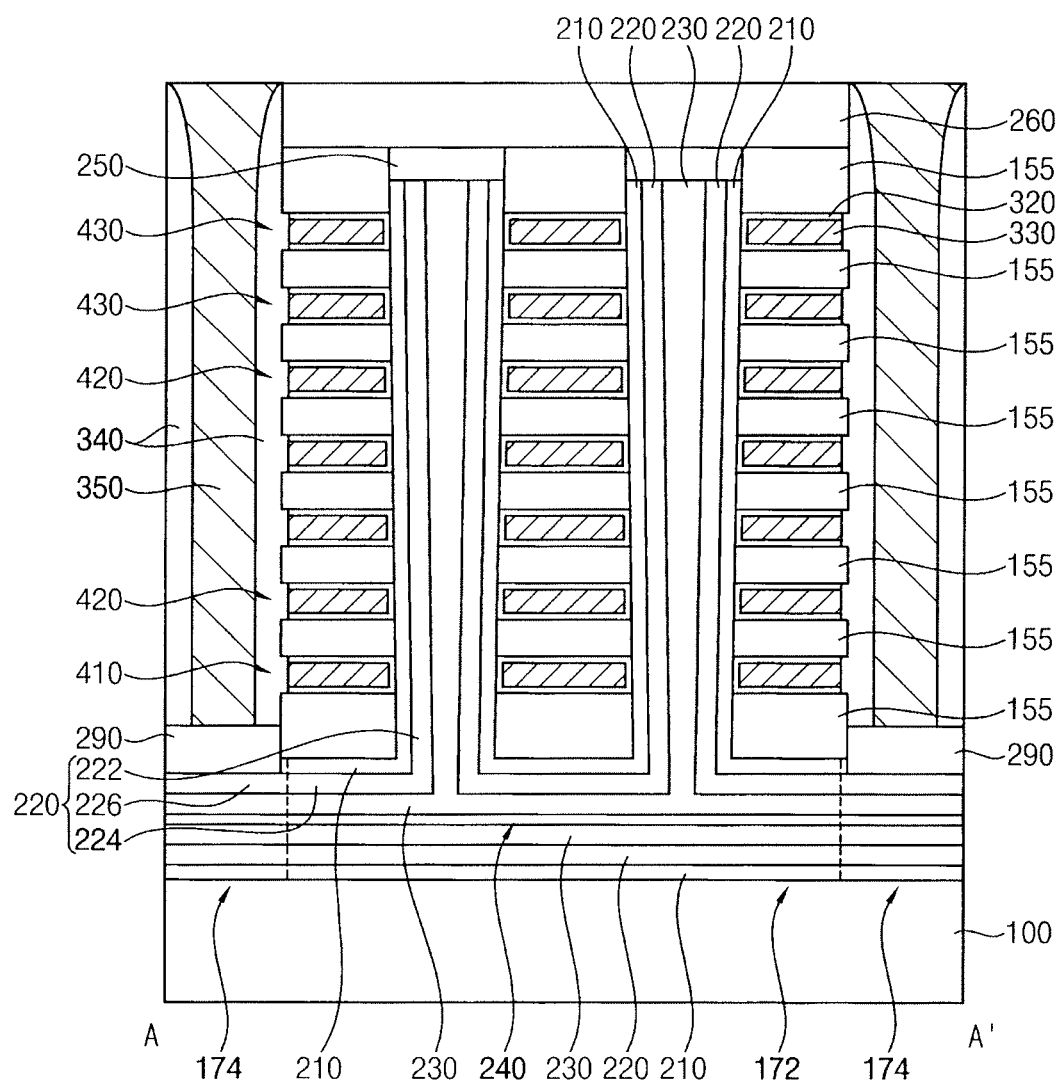
FIG. 41 illustrates a cross-sectional view taken along line A-A' of FIG. 40.
Figure 41:
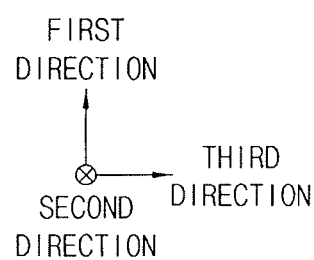

FIG. 40 is a perspective view illustrating a vertical memory device in accordance with example embodiments, and FIG. 41 is a cross-sectional view taken along line A-A' of FIG. 40. This vertical memory device may be manufactured by using a portion of the third sacrificial pattern in a region Z illustrated in FIG. 33, and may be substantially the same as or similar to the vertical memory device described with reference to FIGS. 1 to 4, except for the shapes of the channel and the epitaxial layer. Accordingly, like reference numerals refer to like elements, and detailed descriptions thereof are omitted herein.

Referring to FIGS. 40 and 41, the second gap 174 may have a fifth width W5 in the second direction, which may be greater than the fourth width W4 illustrated in FIG. 23. Accordingly, not only the charge storage structure 210 and the channel 220, but also the filling pattern 230 and the second air gap 245 may be further formed in the second gap 174.

Figure 42:
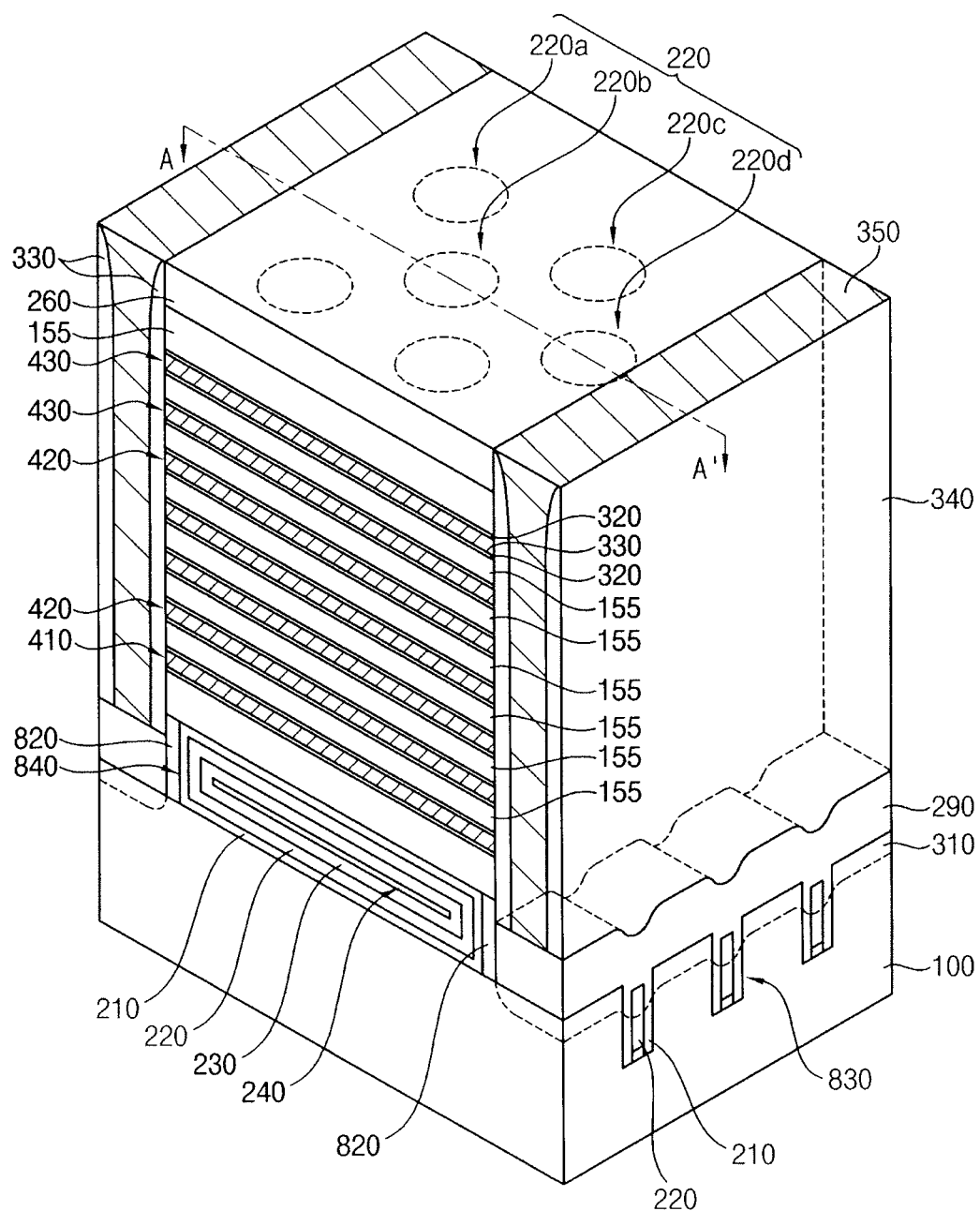
FIG. 42 illustrates a perspective view of a vertical memory device in accordance with example embodiments.
Figure 42:
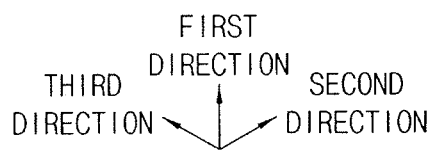
Figure 43:
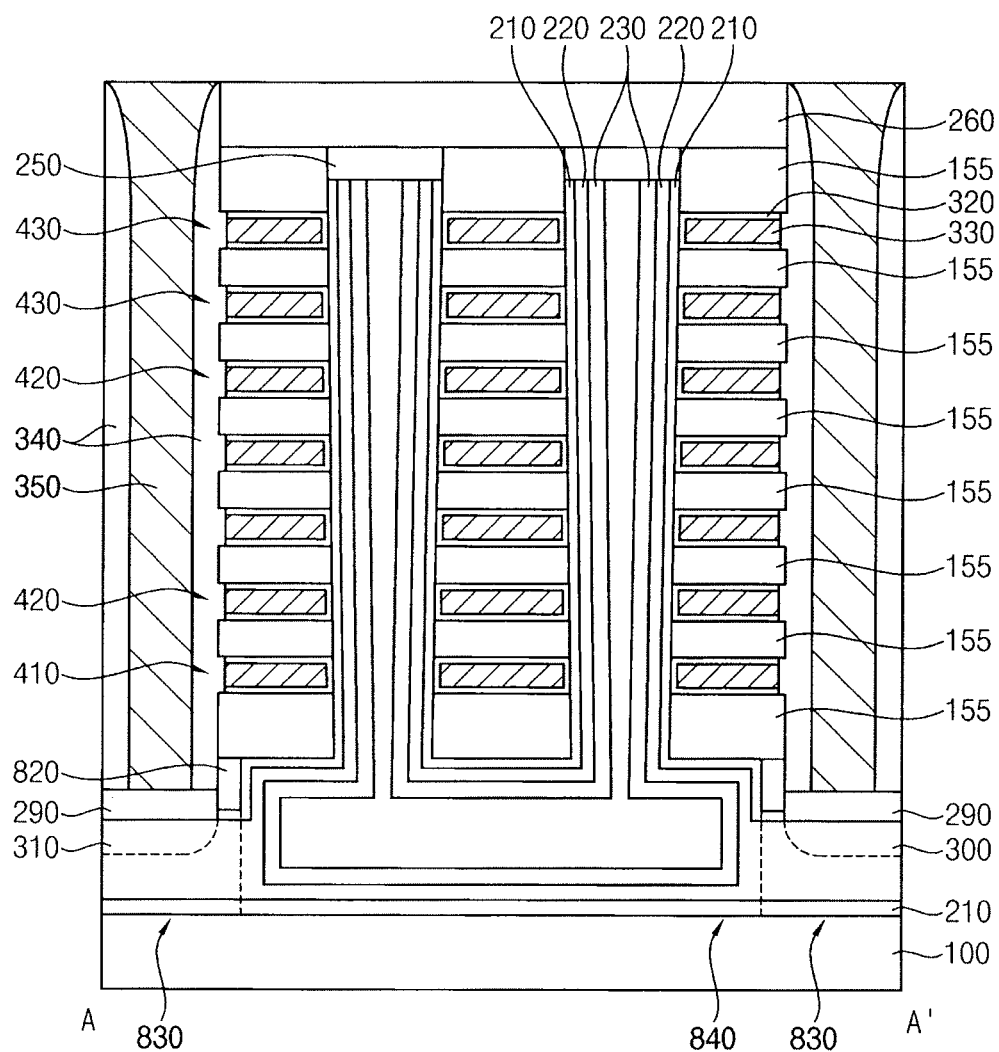
FIG. 43 illustrates a cross-sectional view taken along line A-A' of FIG. 42.
Figure 43:
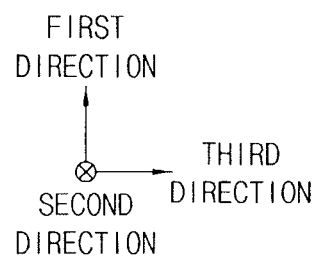

FIG. 42 is a perspective view illustrating a vertical memory device in accordance with example embodiments, and FIG. 43 is a cross-sectional view taken along a line A-A' of FIG. 42. This vertical memory device may be substantially the same as or similar to the vertical memory device described with reference to FIGS. 1 to 4, except for some elements. Accordingly, like reference numerals refer to like elements, and detailed descriptions thereon are omitted herein.

Referring to FIGS. 42 and 43, the vertical memory device may further include a third insulating interlayer 820 between the substrate 100 and the mold, a plurality of third trenches 830, each of which may extend in the third direction, may be formed through an upper portion of the substrate 100, and a fourth opening 840 may be formed to extend through the third insulating interlayer 820 in the second direction. In example embodiments, a central portion of each of the third trenches 830 in the third direction may be overlapped with the fourth opening 840 in the first direction.

The charge storage structure 210, the plate 224 of the channel 220, the filling pattern 230 and the first air gap 240 may be sequentially stacked from an inner wall of the fourth opening 840 toward an inside thereof, and the charge storage structure 210 and the horizontal portion 226 of the channel 220 may be sequentially stacked from a lower surface of the third trench 830.

In example embodiments, a first portion of the plate 224 of the channel 220 not overlapping the third trench 830 in the first direction may have a lower surface higher than that of a second portion of the plate 224 of the channel 220 overlapping the third trench 830 in the first direction, and the distance between the lower surface and an upper surface of the first portion of the plate 224 of the channel 220 may be shorter than that of the second portion of the plate 224 of the channel 220. In example embodiments, a lower surface of the horizontal portion 226 of the channel 220 may be substantially coplanar with a lowermost surface of the plate 224 of the channel 220, and an upper surface of the horizontal portion 226 of the channel 220 may be lower than an upper surface of the plate 224 of the channel 220.

FIGS. 44 to 47 are perspective views illustrating stages of a method of manufacturing a vertical memory device in accordance with example embodiments. This method of manufacturing the vertical memory device may include processes substantially the same as or similar to the processes described with reference to FIGS. 5 to 21 and FIGS. 1 to 4. Accordingly, detailed descriptions thereon are omitted herein.

Figure 44:
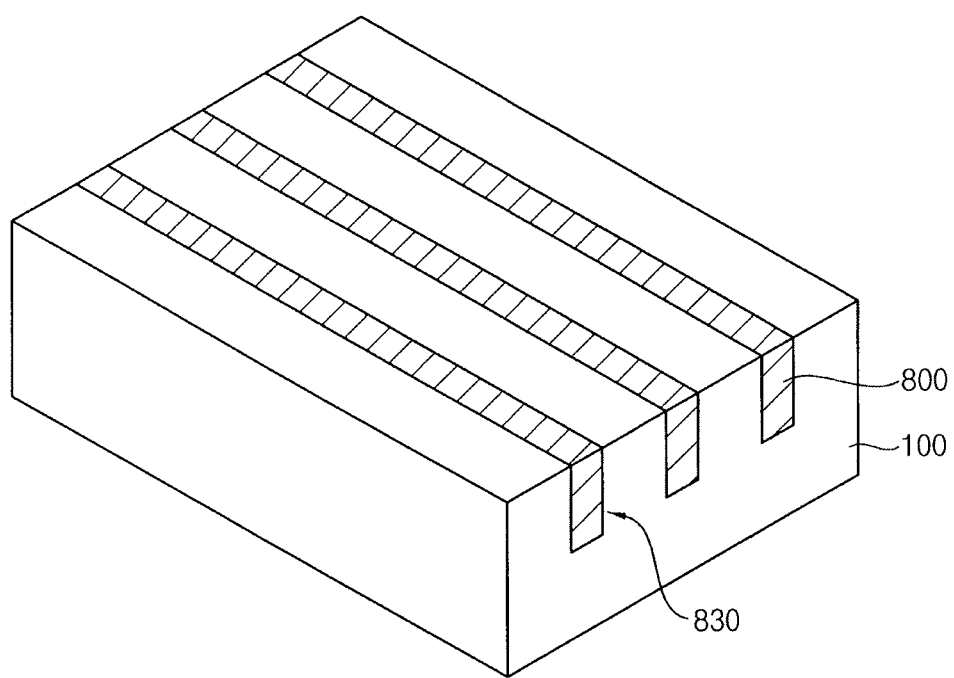
FIGS. 44 to 47 illustrate perspective views of stages in a method of manufacturing a vertical memory device in accordance with example embodiments.
Figure 44:
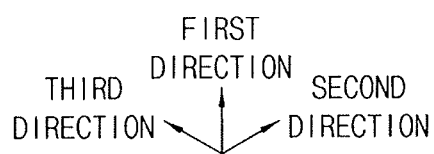

Referring to FIG. 44, third trenches 830 each of which may extend in the third direction may be formed at an upper portion of a substrate 100, and a tenth sacrificial pattern 800 may be formed to fill each of the third trenches 830.

Figure 45:
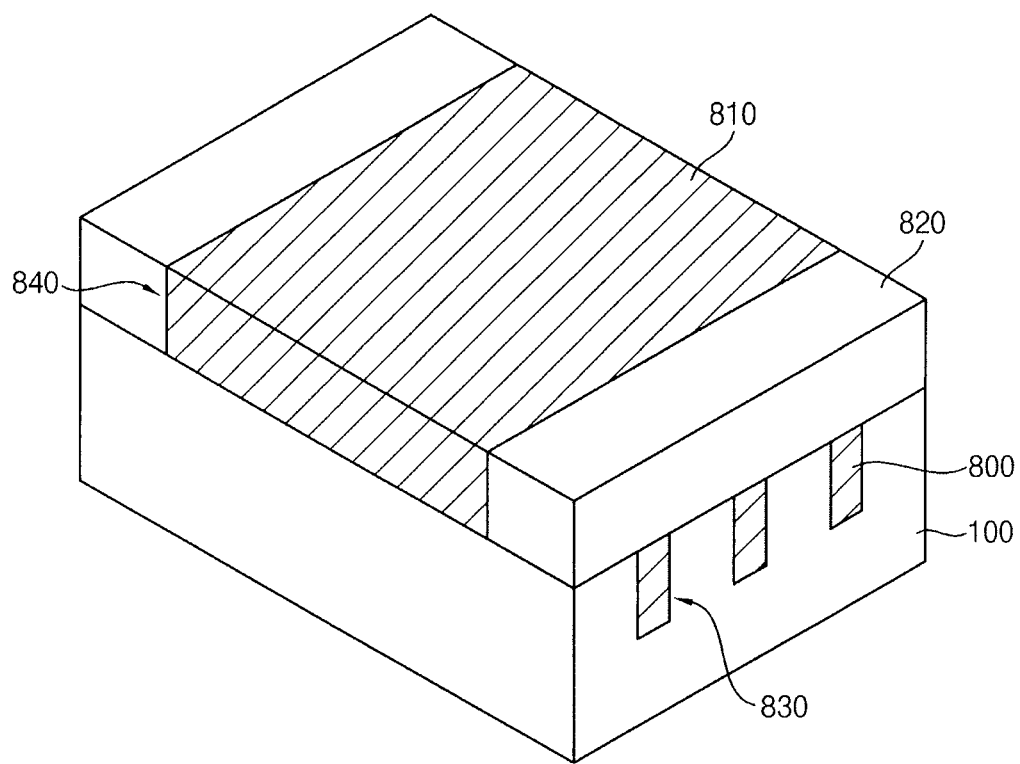
Figure 45:
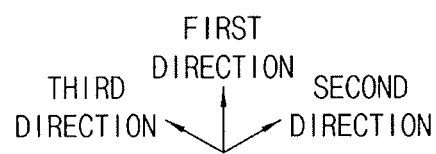

Referring to FIG. 45, a third insulating interlayer 820 may be formed on the substrate 100 on which the tenth sacrificial pattern 800 is formed, a fourth opening 840 may be formed through the third insulating interlayer 820 to extend in the second direction exposing an upper surface of the substrate 100 and an upper surface of the tenth sacrificial pattern 800, and an eleventh sacrificial pattern 810 may be formed to fill the fourth opening 840.

That is, the tenth and eleventh sacrificial patterns 800 and 810 may be formed at respective different levels. However, a central portion in the third direction of each of the tenth sacrificial patterns 800 may be overlapped with the eleventh sacrificial pattern 810 in the first direction.

Figure 46:
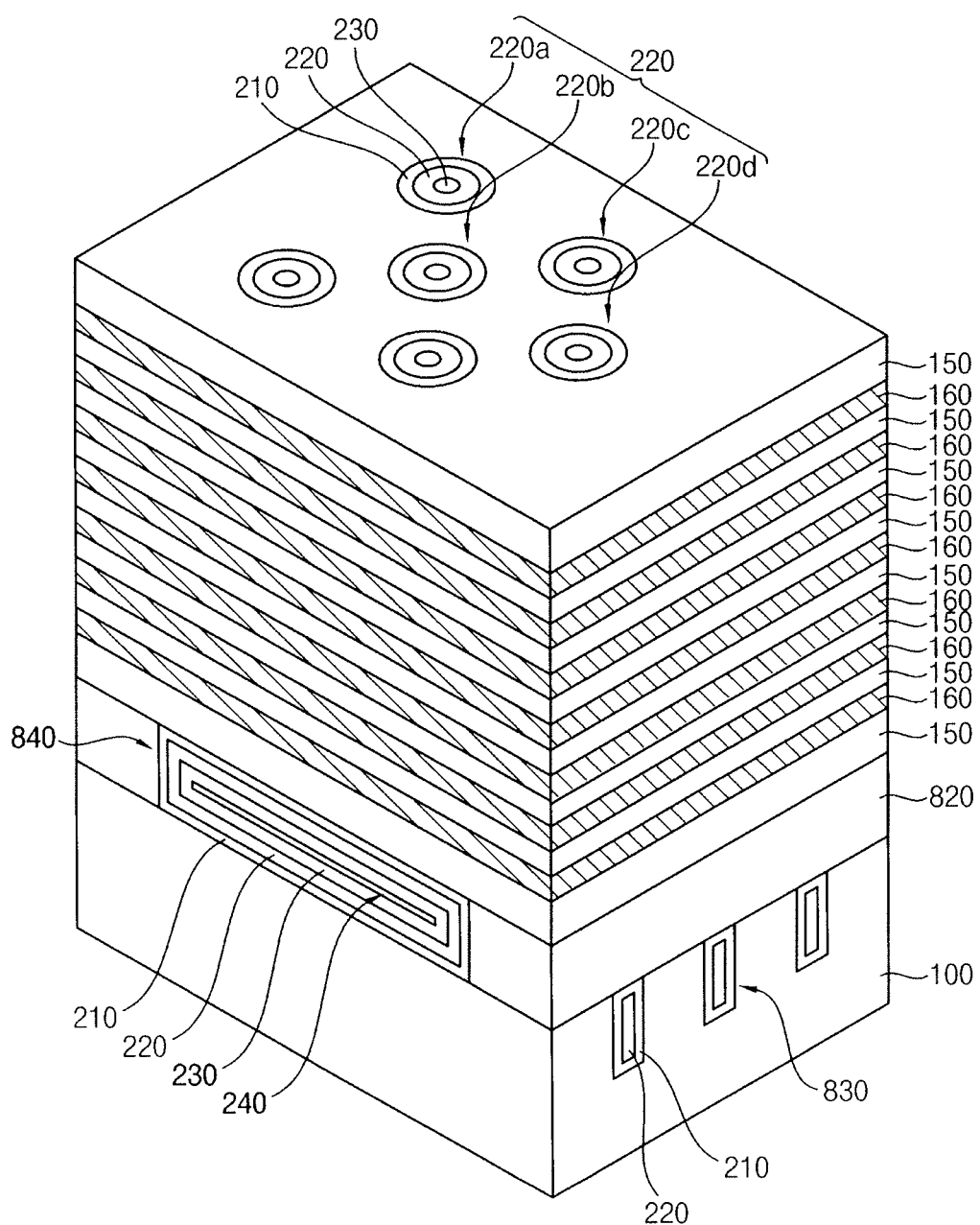
Figure 46:
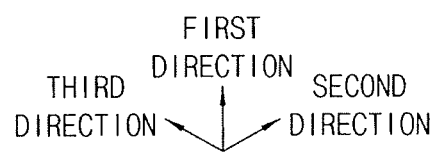

Referring to FIG. 46, processes substantially the same as or similar to the processes described with reference to FIGS. 7 to 11 may be performed.

That is, the eleventh sacrificial pattern 810 may be removed through the channel hole 170 to form the fourth opening 840 again, and the tenth sacrificial patterns 800 connected to the eleventh sacrificial pattern 810 may be also removed to form the third trench 830 again.

The charge storage structure 210, the channel 220, the filling pattern 230 and the first air gap 240 may be sequentially stacked from an inner wall of the fourth opening 840 toward an inside thereof in the fourth opening 840, and the charge storage structure 210 and the channel 220 may be sequentially stacked from an inner wall of the third trench 830 toward an inside thereof in the third trench 830.

However, the plate 224 of the channel 220 in the fourth opening 840 may have a height difference between a lower surface of a portion of the plate 224 of the channel 220 overlapped with the third trench 830 and a lower surface of a portion of the plate 224 of the channel 220 not overlapped with the third trench 830.

Figure 47:
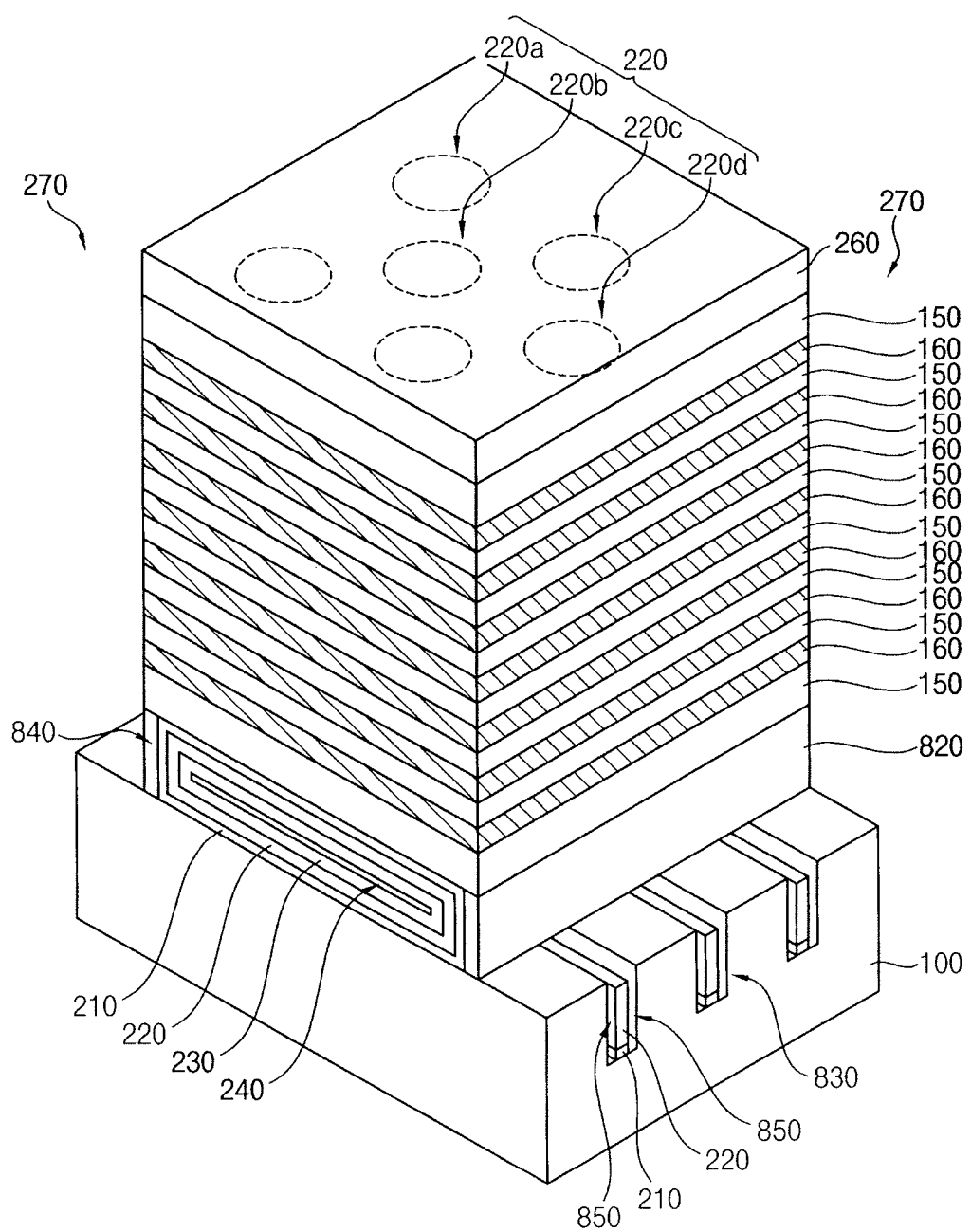

Referring to FIG. 47, processes substantially the same as or similar to the processes described with reference to FIGS. 12 and 13 may be performed.

Accordingly, a portion of the charge storage structure 210 in the third trench 830 may be removed to form a fifth gap 850.

Figure 48:
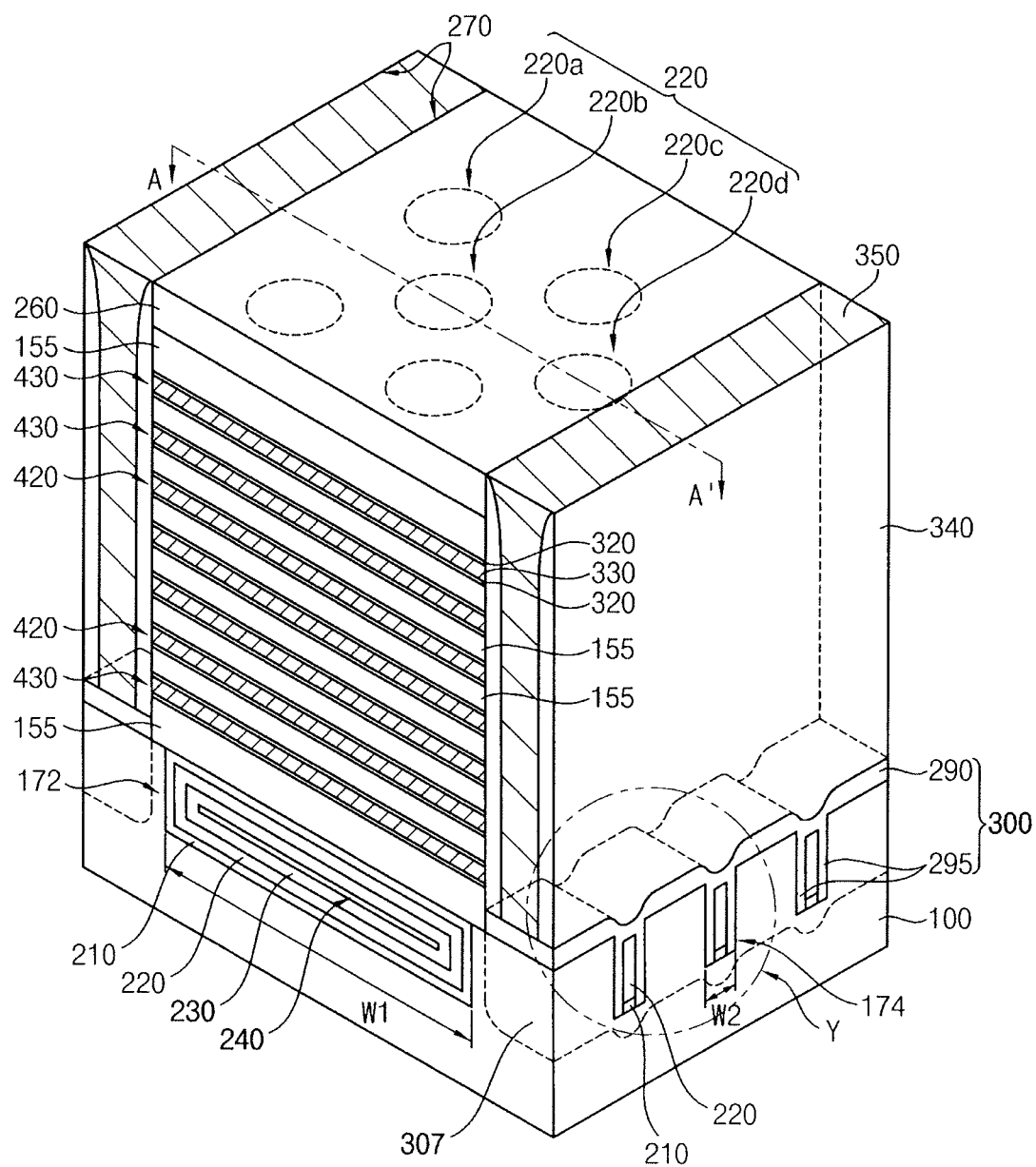
FIG. 48 illustrates a perspective view of a vertical memory device in accordance with example embodiments.
Figure 48:
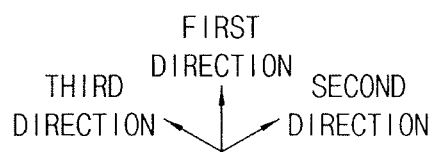
Figure 49:
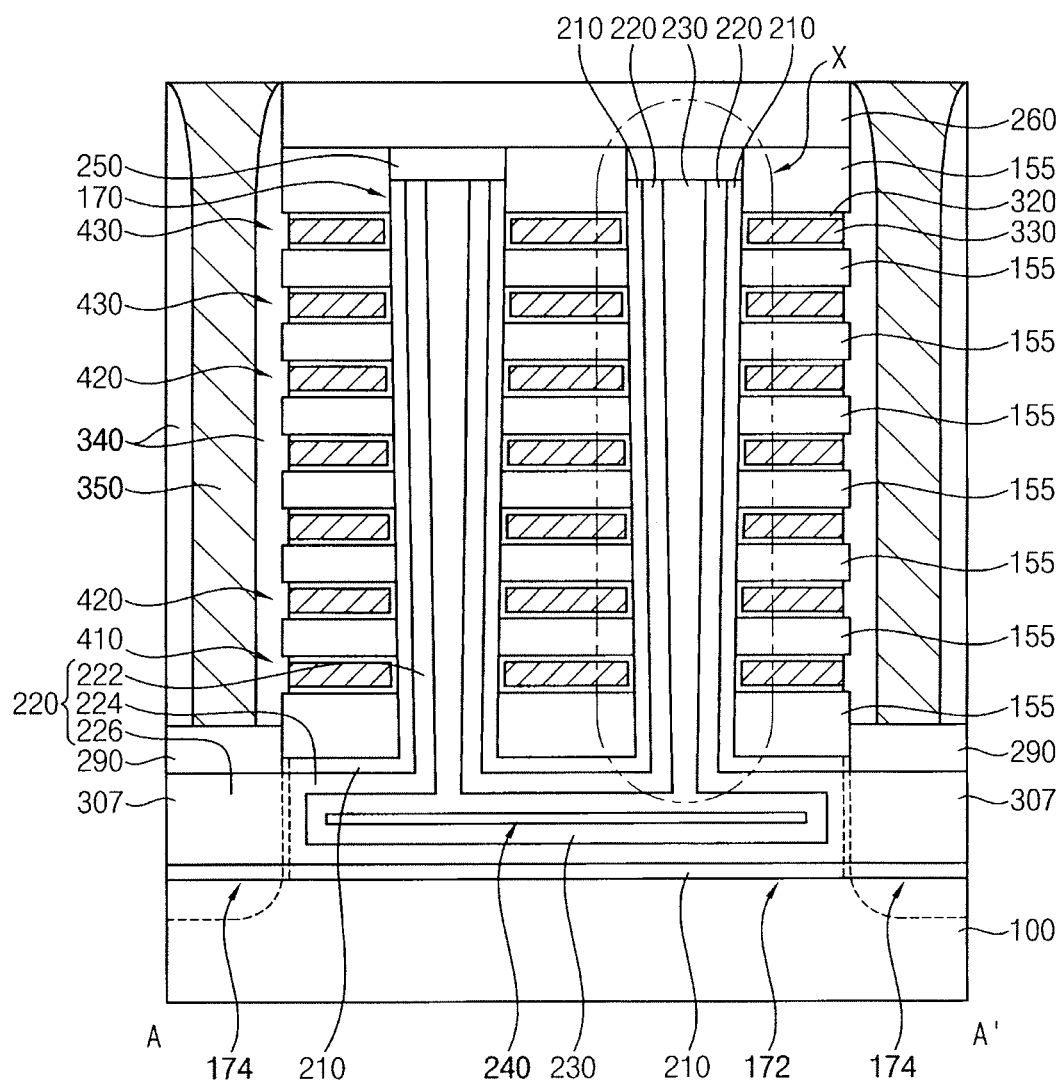
FIG. 49 illustrates a cross-sectional view taken along line A-A' of FIG. 48.
Figure 49:
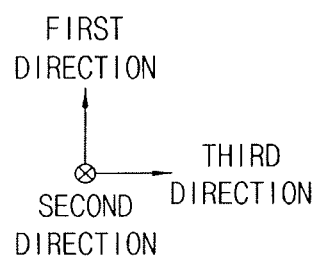
Figure 50:
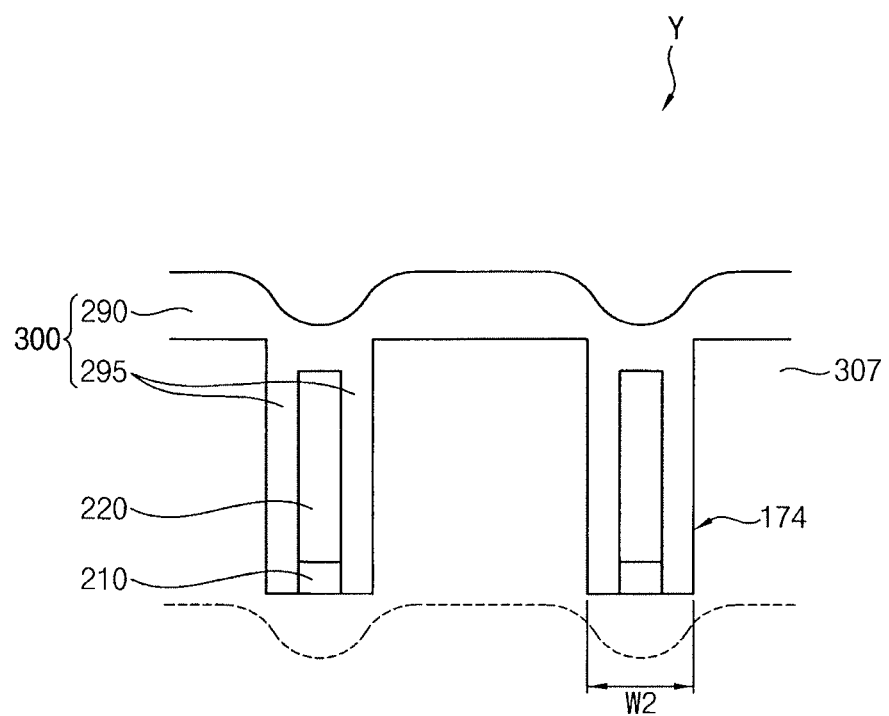
FIG. 50 illustrates a side view of region Y of FIG. 48.

Referring again FIGS. 42 and 43, processes substantially the same as or similar to the processes described with reference to FIGS. 14 to 21 and FIGS. 1 to 4 may be performed to complete the fabrication of the vertical memory device FIG. 48 is a perspective view illustrating a vertical memory device in accordance with example embodiments, FIG. 49 is a cross-sectional view taken along a line A-A' of FIG. 48, and FIG. 50 is a side view of a region Y of FIG. 48.

This vertical memory device may be substantially the same as or similar to the vertical memory device described with reference to FIGS. 1 to 4, except for a source region. Accordingly, like reference numerals refer to like elements, and detailed descriptions thereon are omitted herein.

Referring to FIGS. 48 to 50, the vertical memory device may include a third source region 307, which may be formed in the first epitaxial layer 300, and portions of the horizontal portion 226 of the channel 220 and the substrate 100 adjacent to the first epitaxial layer 300 in the second direction.

That is, unlike the first source region 310 illustrated in FIGS. 1 to 4, the third source region 307 may be formed in the entire portion of the first epitaxial layer 300 including not only an upper portion but also a lower portion thereof, and may be also formed at portions of the horizontal portion 226 of the channel 220 and the substrate 100 adjacent to the first epitaxial layer 300.

The third source region 307 may be formed by doping impurities into the entire portion of the first epitaxial layer 300 during the doping process described with reference to FIGS. 17 to 19.

By way of way of summation and review, example embodiments provide a vertical memory device having improved electrical characteristics. Example embodiments provide a method of manufacturing a vertical memory device having improved electrical characteristics.

That is, in a method of manufacturing a vertical memory device according to example embodiments, there is no need to partially remove a charge storage structure formed on an inner wall of a channel hole in which a channel is formed extending through a mold, the channel hole may not be formed in a large size, and the vertical memory device may have a high integration degree.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A vertical memory device, comprising:
   a substrate having a trench structure;
   gate electrodes on the substrate, the gate electrodes being spaced apart from each other in a first direction substantially vertical to an upper surface of the substrate;
   a channel including:
      a vertical portion extending through the gate electrodes in the first direction, and
      a horizontal portion extending in the trench structure in a second direction substantially parallel to the upper surface of the substrate, the horizontal portion being connected the vertical portion; and
   an epitaxial layer on a first portion of the substrate and connected to the horizontal portion of the channel, the first portion of the substrate being adjacent to ends of the gate electrodes in the second direction while having a non-overlapping relationship at least with the vertical portion of the channel in the first direction.

2. The vertical memory device as claimed in claim 1, wherein:
   each of the gate electrodes extends in a third direction substantially parallel to the upper surface of the substrate and substantially orthogonal to the second direction, and
   the epitaxial layer extends in the third direction on the first portion of the substrate that does not overlap the gate electrodes in the first direction.

3. The vertical memory device as claimed in claim 2, wherein the epitaxial layer has an upper surface that is curved.

4. The vertical memory device as claimed in claim 2, wherein:
   the horizontal portion of the channel includes a second portion not overlapped with the gate electrodes in the first direction, and
   the epitaxial layer is on the first portion of the substrate and on the second portion of the horizontal portion of the channel.

5. The vertical memory device as claimed in claim 4, wherein a portion of the epitaxial layer on the first portion of the substrate has an upper surface lower than that of a portion of the epitaxial layer on the second portion of the horizontal portion of the channel.

6. The vertical memory device as claimed in claim 4, wherein the epitaxial layer contacts a sidewall of the second portion of the horizontal portion of the channel and the substrate.

7. The vertical memory device as claimed in claim 6, wherein at least a portion of the epitaxial layer includes N-type or P-type impurities to define a source region.

8. The vertical memory device as claimed in claim 7, wherein an upper portion of the first portion of the substrate and an upper portion of the second portion of the horizontal portion of the channel include N-type or P-type impurities to define the source region together with at least a portion of the epitaxial layer.

9. The vertical memory device as claimed in claim 7, wherein an upper portion of the epitaxial layer includes N-type or P-type impurities to define the source region, a lower portion of the epitaxial layer including no impurities and connecting the horizontal portion of the channel to the substrate.

10. The vertical memory device as claimed in claim 7, wherein an entire portion of the epitaxial layer includes N-type or P-type impurities to define the source region.

11. The vertical memory device as claimed in claim 10, wherein an upper portion of the first portion of the substrate and the second portion of the horizontal portion of the channel include N-type or P-type impurities to define the source region together with the epitaxial layer.

12. The vertical memory device as claimed in claim 2, wherein the epitaxial layer is connected to an end in the second direction of the horizontal portion of the channel.

13. The vertical memory device as claimed in claim 2, wherein each of the vertical portion of the channel and the horizontal portion of the channel is arranged in a plural number in the third direction, the horizontal portions of the channel connected to the vertical portions of the channel, respectively, being connected to the epitaxial layer in common.

14. The vertical memory device as claimed in claim 13, wherein the epitaxial layer is connected in common on the first portion of the substrate and the horizontal portions of the channel arranged in the third direction.

15. The vertical memory device as claimed in claim 2, wherein the vertical portion of the channel is arranged in a plural number in each of the second and third directions, and the horizontal portion of the channel is arranged in a plural number in the third direction to be connected in common to the vertical portions of the channel arranged in the second direction.

16. The vertical memory device as claimed in claim 1, further comprising:
   an etch stop layer on the substrate, the etch stop layer being under the trench structure; and
   a plate in the channel and on the etch stop layer, the vertical portion of the cannel extending from the plate upwardly in the first direction, and the horizontal portion of the channel extending horizontally from the plate.

17. The vertical memory device as claimed in claim 16, further comprising a filling pattern in an inner space defined by the plate of the channel.

18. The vertical memory device as claimed in claim 17, further comprising an air gap at an inside of the filling pattern.

19. The vertical memory device as claimed in claim 16, further comprising a charge storage structure covering upper and lower surfaces of the plate of the channel.

20. A vertical memory device, comprising:
   gate electrodes spaced apart from each other on a substrate in a first direction substantially vertical to an upper surface of the substrate, each of the gate electrodes extending in a second direction substantially parallel to the upper surface of the substrate;
   a channel including:
      a vertical portion extending through the gate electrodes in the first direction on the substrate, and
      a horizontal portion extending in a third direction, which is substantially parallel to the upper surface of the substrate and intersects the second direction, from an end of the vertical portion to a first portion of the substrate not overlapped with the gate electrodes in the first direction; and
   an epitaxial layer on the first portion of the substrate, the epitaxial layer contacting the horizontal portion of the channel,
   wherein the epitaxial layer and an upper portion of the horizontal portion of the channel define a source region, and a lower portion of the horizontal portion of the channel is connected to the substrate through a lower portion of the epitaxial layer.

* * * * *